(12) United States Patent
Nishi et al.

(10) Patent No.: US 7,919,779 B2
(45) Date of Patent: Apr. 5, 2011

(54) SEMICONDUCTOR DEVICE AND METHOD OF MANUFACTURING THEREOF

(75) Inventors: Kazuo Nishi, Minamiarupusu (JP); Toru Takayama, Atsugi (JP); Yuugo Goto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/369,802

(22) Filed: Feb. 12, 2009

(65) Prior Publication Data
US 2009/0212285 A1    Aug. 27, 2009

Related U.S. Application Data

(60) Continuation of application No. 11/523,642, filed on Sep. 20, 2006, now Pat. No. 7,501,306, which is a division of application No. 10/749,552, filed on Jan. 2, 2004, now Pat. No. 7,449,718.

(30) Foreign Application Priority Data

Jan. 8, 2003    (JP) .................................. 2003-002667

(51) Int. Cl.
*H01L 29/04* (2006.01)
(52) U.S. Cl. ....... 257/72; 257/53; 257/59; 257/E25.004; 257/E25.032
(58) Field of Classification Search .................... 257/52, 257/53, 57, 59, 72, E25.004, E25.01, E25.032
See application file for complete search history.

(56) References Cited

U.S. PATENT DOCUMENTS

| | | | |
|---|---|---|---|
| 5,352,921 A | 10/1994 | Codama et al. | |
| 5,501,989 A | 3/1996 | Takayama et al. | |
| 5,589,694 A | 12/1996 | Takayama et al. | |
| 5,648,662 A | 7/1997 | Zhang et al. | |
| 5,744,822 A | 4/1998 | Takayama et al. | |
| 5,757,456 A | 5/1998 | Yamazaki et al. | |
| 5,811,328 A | 9/1998 | Zhang et al. | |
| 5,821,138 A | 10/1998 | Yamazaki et al. | |
| 5,834,327 A * | 11/1998 | Yamazaki et al. | 438/30 |
| 6,087,648 A | 7/2000 | Zhang et al. | |

(Continued)

FOREIGN PATENT DOCUMENTS

CN    1231065    10/1999

(Continued)

OTHER PUBLICATIONS

International Search Report (Application No. PCT/JP2003/016355) Dated Feb. 10, 2004.

(Continued)

*Primary Examiner* — Matthew E Warren
(74) *Attorney, Agent, or Firm* — Eric J. Robinson; Robinson Intellectual Property Law Office, P.C.

(57) ABSTRACT

The manufacturing method of a semiconductor device according to the present invention comprises steps of forming a metal film, an insulating film, and an amorphous semiconductor film in sequence over a first substrate; crystallizing the metal film and the amorphous semiconductor film; forming a first semiconductor element by using the crystallized semiconductor film as an active region; attaching a support to the first semiconductor element by using an adhesive; causing separation between the metal film and the insulating film; attaching a second substrate to the separated insulating film; separating the support by removing the adhesive; forming an amorphous semiconductor film over the first semiconductor element; and forming a second semiconductor element using the amorphous semiconductor film as an active region.

13 Claims, 11 Drawing Sheets

U.S. PATENT DOCUMENTS

| | | | |
|---|---|---|---|
| 6,118,502 A | 9/2000 | Yamazaki et al. | |
| 6,124,155 A | 9/2000 | Zhang et al. | |
| 6,127,199 A | 10/2000 | Inoue et al. | |
| 6,166,399 A | 12/2000 | Zhang et al. | |
| 6,194,740 B1 | 2/2001 | Zhang et al. | |
| 6,198,133 B1 | 3/2001 | Yamazaki et al. | |
| 6,204,519 B1 | 3/2001 | Yamazaki et al. | |
| 6,236,063 B1 | 5/2001 | Yamazaki et al. | |
| 6,243,155 B1 | 6/2001 | Zhang et al. | |
| 6,274,861 B1 * | 8/2001 | Zhang et al. | 250/208.1 |
| 6,287,888 B1 | 9/2001 | Sakakura et al. | |
| 6,335,213 B1 | 1/2002 | Zhang et al. | |
| 6,372,608 B1 | 4/2002 | Shimoda et al. | |
| 6,376,333 B1 | 4/2002 | Yamazaki et al. | |
| 6,399,933 B2 | 6/2002 | Zhang et al. | |
| 6,423,614 B1 | 7/2002 | Doyle | |
| 6,437,370 B1 | 8/2002 | Matsuno | |
| 6,462,806 B2 | 10/2002 | Zhang et al. | |
| 6,496,240 B1 | 12/2002 | Zhang et al. | |
| 6,521,511 B1 | 2/2003 | Inoue et al. | |
| 6,531,711 B2 | 3/2003 | Sakakura et al. | |
| 6,583,439 B2 | 6/2003 | Yamazaki et al. | |
| 6,645,830 B2 | 11/2003 | Shimoda et al. | |
| 6,680,764 B2 | 1/2004 | Zhang et al. | |
| 6,692,984 B2 | 2/2004 | Yonezawa et al. | |
| RE38,466 E | 3/2004 | Inoue et al. | |
| 6,700,631 B1 | 3/2004 | Inoue et al. | |
| 6,724,012 B2 | 4/2004 | Kimura | |
| 6,744,116 B1 | 6/2004 | Doyle | |
| 6,756,258 B2 | 6/2004 | Zhang et al. | |
| 6,784,411 B2 | 8/2004 | Zhang et al. | |
| 6,797,548 B2 | 9/2004 | Zhang et al. | |
| 6,806,169 B2 | 10/2004 | Gosain et al. | |
| 6,818,530 B2 | 11/2004 | Shimoda et al. | |
| 6,825,492 B2 | 11/2004 | Yonezawa et al. | |
| 6,846,703 B2 | 1/2005 | Shimoda et al. | |
| 6,847,064 B2 | 1/2005 | Zhang et al. | |
| 6,858,898 B1 | 2/2005 | Hayakawa et al. | |
| 6,864,950 B2 | 3/2005 | Zhang et al. | |
| 6,867,752 B1 | 3/2005 | Yamazaki et al. | |
| 6,878,607 B2 | 4/2005 | Inoue et al. | |
| 6,891,391 B2 | 5/2005 | Hiroki | |
| 6,937,306 B2 | 8/2005 | Zhang et al. | |
| 6,953,599 B2 | 10/2005 | Shiotsuka et al. | |
| 6,956,234 B2 | 10/2005 | Kato et al. | |
| 6,995,753 B2 | 2/2006 | Yamazaki et al. | |
| 7,030,551 B2 | 4/2006 | Yamazaki et al. | |
| 7,042,548 B2 | 5/2006 | Zhang et al. | |
| 7,067,392 B2 | 6/2006 | Yamazaki et al. | |
| 7,088,401 B1 | 8/2006 | Ihara et al. | |
| 7,094,665 B2 | 8/2006 | Shimoda et al. | |
| 7,147,740 B2 | 12/2006 | Takayama et al. | |
| 7,158,098 B2 | 1/2007 | Yamazaki et al. | |
| 7,158,199 B2 | 1/2007 | Zhang et al. | |
| 7,169,636 B2 | 1/2007 | Maruyama et al. | |
| 7,180,092 B2 | 2/2007 | Yamazaki et al. | |
| 7,235,814 B2 | 6/2007 | Zhang et al. | |
| 7,253,391 B2 | 8/2007 | Koyama et al. | |
| 7,271,858 B2 | 9/2007 | Yamazaki et al. | |
| 7,279,673 B2 | 10/2007 | Kimura | |
| 7,285,476 B2 | 10/2007 | Shimoda et al. | |
| 7,351,605 B2 | 4/2008 | Yonezawa et al. | |
| 7,449,718 B2 | 11/2008 | Nishi et al. | |
| RE40,601 E | 12/2008 | Inoue et al. | |
| 7,468,308 B2 | 12/2008 | Shimoda et al. | |
| 2001/0030704 A1 | 10/2001 | Kimura | |
| 2001/0038065 A1 | 11/2001 | Kimura | |
| 2002/0043660 A1 | 4/2002 | Yamazaki et al. | |
| 2002/0117694 A1 * | 8/2002 | Migliorato et al. | 257/253 |
| 2003/0032210 A1 | 2/2003 | Takayama et al. | |
| 2003/0071953 A1 | 4/2003 | Yamazaki et al. | |
| 2005/0167573 A1 | 8/2005 | Maruyama et al. | |
| 2006/0186399 A1 | 8/2006 | Yamazaki et al. | |
| 2007/0120132 A1 | 5/2007 | Maruyama et al. | |
| 2007/0267665 A1 | 11/2007 | Koyama et al. | |

FOREIGN PATENT DOCUMENTS

| | | |
|---|---|---|
| EP | 0858110 A | 8/1998 |
| EP | 0924769 | 6/1999 |
| EP | 1014452 | 6/2000 |
| EP | 1017100 | 7/2000 |
| EP | 1351308 A | 10/2003 |
| EP | 1655633 A | 5/2006 |
| EP | 1744365 A | 1/2007 |
| EP | 1758169 A | 2/2007 |
| JP | 05-276311 | 10/1993 |
| JP | 06-275808 | 9/1994 |
| JP | 07-086607 | 3/1995 |
| JP | 10-125931 A | 5/1998 |
| JP | 11-243209 | 9/1999 |
| JP | 2000-058836 | 2/2000 |
| JP | 2002-184959 A | 6/2002 |
| JP | 2002-217390 | 8/2002 |
| JP | 2002-305296 | 10/2002 |

OTHER PUBLICATIONS

"Amorphous Silicon Semiconductor Optical Sensors for Brightness Adjustment, Control of the Lighting Systems, Etc.," BCS Series, TDK Homepage, Jun. 2002.

"Developing a Thin and High Output Visible Light Sensor Using a Plastic Substrate," TDK Homepage (Press Release), Oct. 1, 2003.

"A Visible Light Sensor and an Amplifier Circuit Succeeded in Forming Them Within the Size of 2×1.5 MM on a Plastic Chip," Denpa Shinbun, Oct. 2, 2003.

"Bring About High Output and Downsizing," The Nikkan Kogyo Shinbun, Oct. 2, 2003.

"Thin and High Output Visible Light Sensor," Kagaku Kougyou Shinbun, Oct. 2, 2003.

International Perliminary Examination Report (Application No. PCT/03/16355) Dated Jun. 22, 2004.

Search Report (Application No. 03780931.6) Dated Mar. 6, 2007.

Office Action (Application No. 200380108533.1) Dated Apr. 20, 2007.

Office Action (Application No. 92137331) Dated Aug. 27, 2009.

Korean Office Action (Application No. 2005-7012724) Dated Jul. 28, 2010.

* cited by examiner

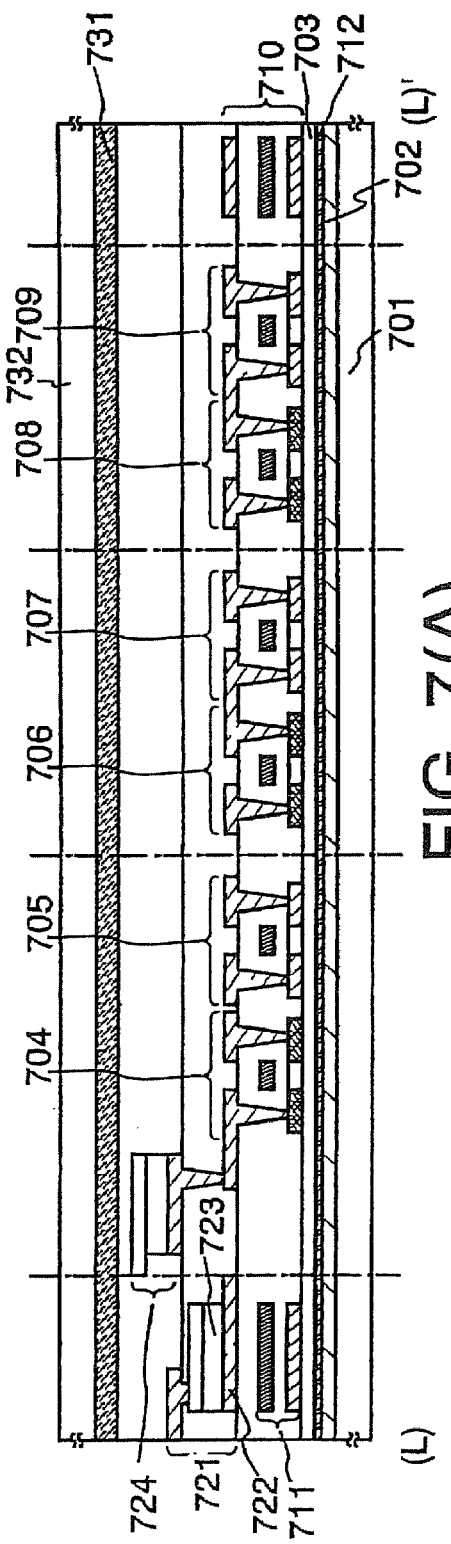
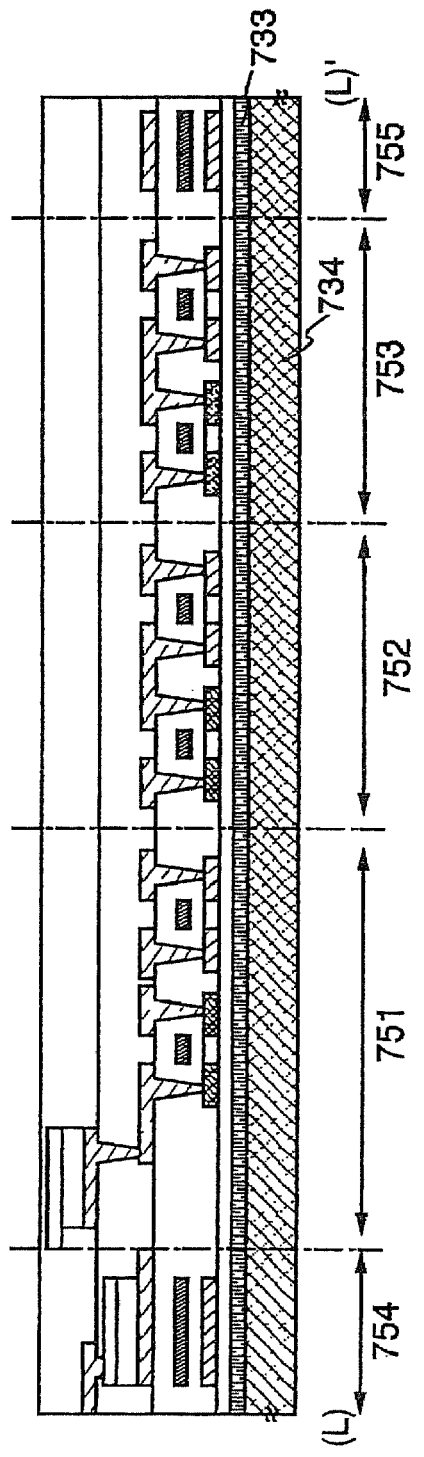
FIG. 7(A)
FIG. 7(B)

SEMICONDUCTOR DEVICE AND METHOD OF MANUFACTURING THEREOF

BACKGROUND OF THE INVENTION

1. Field of the Invention

The present invention relates to a method of manufacturing a thin and lightweight semiconductor device. Specifically, the present invention relates to a method for manufacturing a semiconductor device over an organic resin member or a plastic substrate. In the present invention, a semiconductor device is a semiconductor device including a semiconductor element having an amorphous semiconductor film as an active region and a semiconductor element having a crystalline semiconductor film as an active region, specifically, a semiconductor device including an optical sensor element, a photoelectric conversion device, a solar battery, or the like.

2. Description of Related Art

An optical sensor is used as a sensor for converting an image into an electrical signal in a wide range of fields such as a facsimile machine, a copying machine, a video camera, and a digital still camera. Mainly, a semiconductor is used as a material of the optical sensor, and silicon can be given as a typical example of a semiconductor material. As the optical sensor using silicon, there are an optical sensor using a single crystal silicon or polysilicon film and an optical sensor using an amorphous silicon film. The optical sensor using the single crystal silicon or polysilicon film has a sensitivity peak in an infrared region in the proximity of 800 nm, and has sensitivity up to in the proximity of 1100 nm. Consequently, in the case of sensing a white fluorescent light which hardly includes a spectrum of an infrared region and sunlight which has a wide range of spectra from an ultraviolet region to an infrared region, there is a problem that detected results of each light are different even though actual illuminance is equal.

On the other hand, the optical sensor using amorphous silicon has little sensitivity to light in an infrared region, a sensitivity peak in the proximity of from 500 nm to 600 nm which is in the center of wavelength of a visible light region, and sensing characteristics similar to human spectral luminous efficacy. Therefore, the one using amorphous silicon is preferable as the optical sensor.

The optical sensor using amorphous silicon can be roughly divided into 1) a resistor type and 2) a diode type. The resistor type can provide a large current since it has an amplification effect as a transistor. However, an amplified optical charge does not disappear even after light is blocked since a large quantity of optical charges is generated by amplification. Therefore, response speed thereof is slow, and a dynamic range due to contrast of light is narrow.

Meanwhile, the diode type optical sensor has a depletion layer spreading in amorphous silicon, and easily detects an optical charge generated when light enters. It has high response speed since it does not have an amplification effect, and a dynamic range due to contrast of light is wide. However, a capacitor for retaining a charge or an element for amplifying and outputting an optical charge is required since current due to the optical charge is small.

As an element for amplifying and outputting a current detected by the optical sensor as an output signal by time division (hereinafter, referred to as an amplifying element), there are a bare IC type using a field effect transistor of a single crystal semiconductor (mainly, a silicon semiconductor) and a TFT type using a thin film transistor using a thin amorphous silicon film or polysilicon film as a channel formation region.

An IC type optical sensor has high speed and high reliability as the amplifying element. However, cost is very high since as many bare chip ICs as the optical sensors are required. In addition, both a substrate over which a photoelectric conversion element (photoelectric conversion layer) made of amorphous silicon or the like is to be formed and a bare IC chip are necessary. Therefore, occupied area in an installation substrate such as a printed wiring board is enlarged, which becomes an obstacle to downsizing of an electronic device equipped with the optical sensor.

Meanwhile, an active region of a TFT that is the amplifying element and a photoelectric conversion layer of the photoelectric conversion element can be formed over the same substrate in the TFT type optical sensor. Therefore, occupied area in an installation substrate such as a printed wiring board can be narrowed; consequently, downsizing of the electronic device equipped with the optical sensor is easy. Further, a cost thereof is low compared with that of the IC type optical sensor using single crystal silicon. Since a TFT using a polysilicon film has higher electrical characteristics than that of a TFT using an amorphous silicon film, high-speed response as the amplifying element is possible. Accordingly, it is effective for detecting even a weak photoelectric current to form the amplifying element with the TFT using a polysilicon film (for example, Japanese Patent Laid-Open No. H6-275808 (pp. 3 to 4, FIG. 1)).

However, the optical sensor using a TFT having an active region made of a polysilicon film as the amplifying element, as disclosed in Japanese Patent Laid-Open No. H6-275808, has limitation on the kind of a substrate due to its manufacturing process. Typically, only a substrate that can withstand crystallization temperature or activation temperature of silicon, such as quartz or glass can be used. This is because a heating step at a comparatively high temperature (for example, equal to or more than 500° C.) is required for crystallization or activation of silicon. These substrates have thick film thickness, which causes a problem of increase in parts volume and weight of the optical sensor.

Since glass or the like does not have flexibility, an installation site of the optical sensor is over a flat portion, specifically, over a printed wiring board, and there is limitation on the installation site. Therefore, an attempt to use lightweight and thin, preferably, flexible plastic, or the like as a substrate of the optical sensor has been made. Plastic is lightweight and thin; however, it has a low allowable temperature limit. There is a problem that it is difficult to form the TFT having an active region made of a polysilicon film over this substrate.

In view of the above problems, it is an object of the present invention to manufacture a semiconductor device including a semiconductor element having an active region made of a polysilicon film and a semiconductor element having an active region made of an amorphous silicon film, typically, a semiconductor device including an optical sensor, a photoelectric conversion element, or a solar battery element over a lightweight and thin, preferably, flexible substrate or organic member.

DISCLOSURE OF INVENTION

The present invention is a method for manufacturing a semiconductor device, characterized by comprising the steps of: forming a metal film, an insulating film, and a first amorphous semiconductor film in sequence over a first substrate; crystallizing the first amorphous semiconductor film; forming a first semiconductor element by using the crystallized semiconductor film as an active region; attaching a support to the first semiconductor element; causing separation between the metal film and the insulating film; forming a second amorphous semiconductor film over the first semiconductor element after attaching a second substrate to the separated insulating film and separating the support; and forming a second semiconductor element using the second amorphous semiconductor film as an active region.

It may be a method for manufacturing a semiconductor device, characterized by comprising the steps of: forming a metal film, an insulating film, and a first amorphous semiconductor film in sequence over a first substrate; crystallizing the first amorphous semiconductor film; forming a first semiconductor element by using the crystallized semiconductor film as an active region; forming a second amorphous semiconductor film; forming a second semiconductor element using the second amorphous semiconductor film as an active region; attaching a support to the first semiconductor element and the second semiconductor element; and causing separation between the metal film and the insulating film.

It may be a method for manufacturing a semiconductor device, characterized by comprising the steps of: forming a metal film, an insulating film, and a first amorphous semiconductor film in sequence over a first substrate; crystallizing the first amorphous semiconductor film; forming a first semiconductor element by using the crystallized semiconductor film as an active region; forming a second amorphous semiconductor film; forming a second semiconductor element using the second amorphous semiconductor film as an active region; attaching a support to the first and the second semiconductor elements; causing separation between the metal film and the insulating film; and separating the support after attaching a second substrate to the separated insulating film.

It may be a method for manufacturing a semiconductor device, characterized by comprising the steps of: forming a metal film, an insulating film, and a first amorphous semiconductor film in sequence over a first substrate; crystallizing the first amorphous semiconductor film; forming a first semiconductor element by using the crystallized semiconductor film as an active region; attaching a support to the first semiconductor element by using an adhesive; causing separation between the metal film and the insulating film; forming a second amorphous semiconductor film over the first semiconductor element after attaching a second substrate to the separated insulating film by using an adhesive bond; and forming a second semiconductor element using the second amorphous semiconductor film as an active region.

It may be a method for manufacturing a semiconductor device, characterized by comprising the steps of: forming a metal film, an insulating film, and a first amorphous semiconductor film in sequence over a first substrate; crystallizing the first amorphous semiconductor film; forming a first semiconductor element by using the crystallized semiconductor film as an active region; forming a second amorphous semiconductor film; forming a second semiconductor element using the second amorphous semiconductor film as an active region; attaching a support to the first semiconductor element and the second semiconductor element by using an adhesive; and causing separation between the metal film and the insulating film.

It may be a method for manufacturing a semiconductor device, characterized by comprising the steps of: forming a metal film, an insulating film, and a first amorphous semiconductor film in sequence over a first substrate; crystallizing the first amorphous semiconductor film; forming a first semiconductor element by using the crystallized semiconductor film as an active region; forming a second amorphous semiconductor film; forming a second semiconductor element using the second amorphous semiconductor film as an active region; attaching a support to the first and the second semiconductor elements by using an adhesive; causing separation between the metal film and the insulating film; and separating the support by removing the adhesive after attaching a second substrate to the separated insulating film by using an adhesive bond.

The method for manufacturing a semiconductor device is characterized in that metal oxide is formed between the metal film and the insulating film.

The method for manufacturing a semiconductor device is characterized in that the separation between the metal film and the insulating film occurs between the metal film and the metal oxide film, within the metal oxide film, or between the metal oxide film and the insulating film.

The method for manufacturing a semiconductor device is characterized in that the first amorphous semiconductor film and the second amorphous semiconductor film include hydrogen.

The method for manufacturing a semiconductor device is characterized in that the first semiconductor element is a thin film transistor.

The method for manufacturing a semiconductor device is characterized in that the second semiconductor element is a diode or a thin film transistor.

The method for manufacturing a semiconductor device is characterized in that the crystallization is performed by heat treatment at such a temperature that hydrogen in the first amorphous semiconductor film is released or diffused.

The method for manufacturing a semiconductor device is characterized in that the metal film is a single layer made of an element selected from the group consisting of W, Ti, Ta, Mo, Cr, Nd, Fe, Ni, Co, Zr, Zn, Ru, Rh, Pd, Os, and Ir or an alloy material or a compound material having the element as its main component, or a laminate of the metal or a mixture.

The method for manufacturing a semiconductor device is characterized in that the insulating film is a silicon oxide film, a silicon oxynitride film, or a metal oxide film.

The method for manufacturing a semiconductor device is characterized in that the second substrate is a plastic substrate or an organic resin member.

The method for manufacturing a semiconductor device is characterized in that the semiconductor device includes an optical sensor, a photoelectric conversion element, or a solar battery.

In addition, another invention is a semiconductor device characterized by comprising a first semiconductor element using a crystalline semiconductor film as an active region and a second semiconductor element using an amorphous semiconductor film as an active region over an adhesive.

It may be a semiconductor device characterized by comprising a first semiconductor element using a crystalline semiconductor film as an active region and a second semiconductor element using an amorphous semiconductor film as an active region over a plastic substrate.

It may be a semiconductor device characterized by comprising a first semiconductor element using a crystalline semiconductor film as an active region and a second semiconductor element using an amorphous semiconductor film as an active region over an adhesive, wherein the first semiconductor element and the second semiconductor element are electrically connected to each other.

It may be a semiconductor device characterized by comprising a first semiconductor element using a crystalline semiconductor film as an active region and a second semiconductor element using an amorphous semiconductor film as an active region over a plastic substrate, wherein the first semiconductor element and the second semiconductor element are electrically connected to each other.

The semiconductor device is characterized in that the adhesive is provided with exfoliate paper.

The semiconductor device is characterized in that the first semiconductor element is a thin film transistor The semiconductor device is characterized in that the second semiconductor element is a diode or a thin film transistor.

The semiconductor device is characterized in that the semiconductor device includes an optical sensor, a photoelectric conversion element, or a solar battery.

EFFECT OF THE INVENTION

According to the present invention, a semiconductor device including a semiconductor element having a polysilicon film as an active region and a semiconductor element having an amorphous silicon film as an active region can be formed over a plastic substrate. Namely, an optical sensor, a photoelectric conversion element, a solar battery element, or the like including a TFT having an active region made of a polysilicon film and a diode having an active region made of an amorphous silicon film can be manufactured.

A semiconductor device manufactured according to the present invention can be made more lightweight and thinner compared with a conventional one, since it is formed over a plastic substrate.

In the case where a semiconductor device is an optical sensor or a photoelectric conversion device, a signal detected by a photoelectric conversion element can be amplified by an amplifying element formed of a TFT having a polysilicon film as an active region. Therefore, weak visible light can be detected even when light receiving area of the sensor is small.

Further, it can be made thinner since a plastic substrate is used. Then, selectivity of an installation site is improved; accordingly, area of a mounting substrate can be reduced. In addition, light receiving area of an optical sensor, a photoelectric conversion element, or a solar battery element can be enlarged.

BRIEF DESCRIPTION OF DRAWINGS

FIGS. 7(A) and 7(B) are diagrams showing Embodiment 3 of the present invention.

DETAILED DESCRIPTION OF THE INVENTION

Figure 1A:
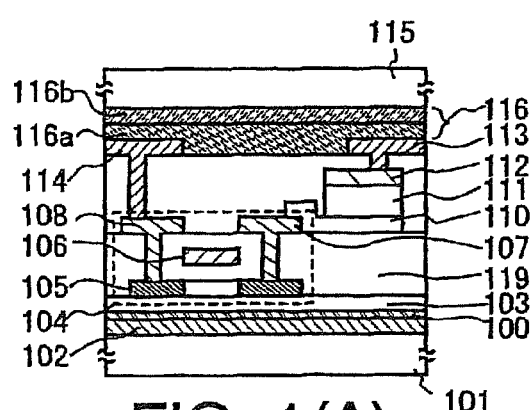
FIGS. 1(A) to 1(E) are diagrams showing Embodiment Mode 1 of the present invention.

Best Mode for Carrying Out the Invention

Hereinafter, embodiment modes of the present invention are described with reference to the drawings. However, the present invention can be carried out in other various modes. As is easily known to a person skilled in the art, the mode and the detail of the invention can be variously changed without departing from the purpose and the range of the present invention. Thus, the present invention is not interpreted while limiting to the following description of this embodiment mode.

Embodiment Mode 1

A method for manufacturing a semiconductor device including a semiconductor element having an amorphous silicon film as an active region and a semiconductor element having a polysilicon film as an active region over a plastic substrate is described in this embodiment mode with reference to FIGS. 1(A) TO 1(E).

First, a metal film 102 is formed over a substrate 101. A single layer made of one element of W, Ti, Ta, Mo, Cr, Nd, Fe, Ni, Co, Zr, Zn, Ru, Rh, Pd, Os, and Ir or an alloy material or a compound material containing the element as its main component, a laminate thereof, a single layer of nitride thereof, or a laminate thereof may be used as the metal film 102. A film thickness of the metal film 102 is set from 10 nm to 200 nm, preferably, from 50 nm to 75 nm.

Next, an insulating film 103 is formed over the metal film 102. At this time, a metal oxide film 100 in an amorphous state is formed between the metal film 102 and the insulating film 103 to have a thickness of approximately from 2 nm to 5 nm. In the following step of separation, separation occurs within the metal oxide film 100, at the interface between the metal oxide film 100 and the insulating film 103, or at the interface between the metal oxide film 100 and the metal film 102. A film made of a silicon oxide, silicon oxynitride, or metal oxide material may be formed as the insulating film 103 by a sputtering method or a plasma CVD method. A film thickness of the insulating film 103 is preferably equal to or more than twice of the metal film 102, preferably, from 150 nm to 200 nm.

Subsequently, a film of a material containing at least hydrogen is formed over the insulating film 103. A semiconductor film, a nitride film, or the like can be used as the film of a material containing at least hydrogen. The semiconductor film is formed in this embodiment mode. Thereafter, heat treatment is performed to diffuse hydrogen contained in the film of a material containing hydrogen. The heat treatment may be performed at a temperature of equal to or more than 410° C. It may be performed separately from a formation process of a crystalline semiconductor film or may be omitted by combination thereof. For example, in the case of using an amorphous silicon film containing hydrogen as the film of a material containing hydrogen and heating it to form a polysilicon film, heat treatment at equal to or more than 500° C. for crystallization enables to diffuse hydrogen at the same time as forming the polysilicon film.

Then, the polysilicon film is etched to have a desired shape by a known method in order to form a TFT. A TFT 104 in FIG. 1(A) includes a polysilicon film 105 having a source region, a drain region, and a channel formation region, a gate insulating film covering the polysilicon film, a gate electrode 106 formed over a channel formation region of the polysilicon film, and a source electrode 107 and a drain electrode 108 connected to the source region and the drain region through an interlayer insulating film 119. Note that the interlayer insulating film 119 is formed by using a plurality of insulating films for insulating the gate electrode from the source electrode and the drain electrode.

Next, a photoelectric conversion element connected to the source electrode 107 of the TFT is formed over the interlayer insulating film 119. A diode is formed as the photoelectric conversion element in this embodiment mode. First, a first electrode 110 connected to the source electrode 107 is formed, and an amorphous silicon film 111 that is a photoelectric conversion layer and a second electrode 112 are formed thereover. Thereafter, the amorphous silicon film 111 and the second electrode 112 are etched to have a desired shape, thereby forming the diode. Then, a wiring 114 connected to the drain electrode 108 and connected to an output terminal as well as a wiring 113 connected to the second electrode of the diode is formed.

Subsequently, a second substrate 115 to be a support for fixing the semiconductor film is attached with an adhesive 116. Note that a substrate having higher rigidity than that of the first substrate 101 is preferably used as the second substrate 115. Typically, a glass substrate, a quartz substrate, a metal substrate, a ceramics substrate, or a plastic substrate can be appropriately used as the second substrate 115. An adhesive made of an organic material is used as the adhesive 116. At this time, a planarizing layer may be formed in a part of the adhesive. In this embodiment mode, a water-soluble resin 116a is applied to the adhesive made of an organic material as the planarizing layer. The second substrate 115 may be attached to the TFT 104 and the diode (reference numerals 110 to 112) by attaching a member 116b with both sides thereof covered with a reactive separating adhesive (hereinafter, referred to as a double-sided sheet) thereto. The following separation step can be performed with comparatively small force by using the attaching method. Various kinds of separating adhesives such as a reactive separating adhesive, a thermally separating adhesive, a photo separating adhesive such as a UV separating adhesive, and an anaerobic separating adhesive can be given as the adhesive made of an organic material.

Figure 1D:
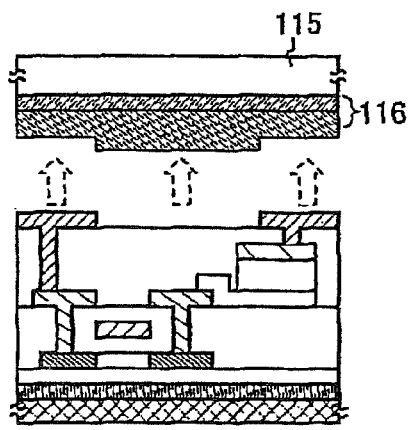
Figure 1B:
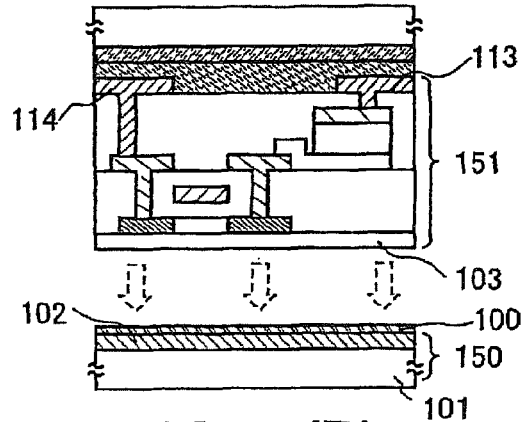

In FIG. 1(B), the first substrate 101 and the metal film 102 formed thereover are referred to as a separation body 150. In addition, a layer from the insulating film 103 to the wiring 113 connected to the second electrode of the diode and the wiring 114 connected to an external terminal is referred to as a laminate body 151.

Then, the metal film 102 over the first substrate 101 and the insulating film 103 are separated from each other by a physical means. Physical force is comparatively small force such as a human hand, a load by using a member having a sharp edge portion such as a wedge, air pressure of a gas sprayed from a nozzle, or ultrasonic waves. Separation occurs within the metal oxide film 100, at the interface between the insulating film 103 and the metal oxide film 100, or at the interface between the metal oxide film 100 and the metal film 102; thus, the separation body 150 and the laminate body 151 can be separated from each other with comparatively small force. In this way, the laminate body 151 can be separated from the separation body 150.

Subsequently, a third substrate 117 and the insulating film 103 (that is, the laminate body 151) are attached to each other with an adhesive bond 118. A plastic substrate or a member made of an organic resin is used as the third substrate 117. A plastic substrate made of PET (polyethylene terephthalate), PEN (polyethylene naphthalate), PES (polyether sulfide), polypropylene, polypropylen sulfide, polycarbonate, polyetherimide, polyphenylene sulfide, polyphenylene oxide, polysulfone, or polyphthalamide can be used as the plastic substrate.

It is important that the adhesive bond 118 is a material having higher adhesiveness between the laminate body 151 including the insulating film 103 and the third substrate 117 than that of the adhesive 116 made of an organic material between the second substrate 115 and the laminate body 151. Various kinds of curing adhesive bonds such as a reactive curing adhesive bond, a thermosetting adhesive bond, photocuring adhesive bond such as a UV-curing adhesive bond, and an anaerobic curing adhesive bond can be given as the adhesive bond 118.

Note that the insulating film 103 may be provided with an adhesive instead of the above step. In this case, exfoliate paper (separate paper, that is, a base material such as a separator and a sheet having a separation surface on either of or both sides) may be provided so that the adhesive does not attach to another member. When the separate paper is separated, the adhesive can attach to an arbitrary member. Therefore, a substrate is not necessary, and a semiconductor device can be made thinner.

Subsequently, the adhesive 116 and the second substrate 115 are separated from the laminate body 151 as shown in FIG. 1(D). The adhesive 116 made of an organic material is reacted to heat, light, humidity, or is chemically reacted (decreasing adhesion by using water, oxygen, or the like, for example), so that the adhesive 116 made of an organic material and the second substrate 115 are separated from the laminate body 151.

Figure 1E:
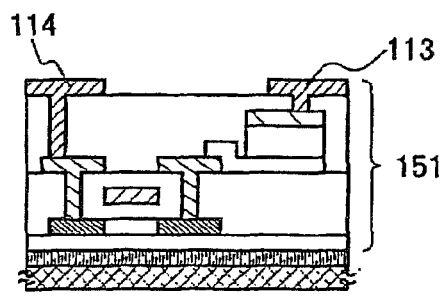
Figure 1C:
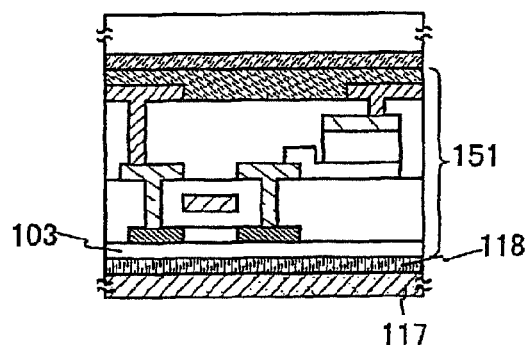

According to the above steps, a semiconductor device having a TFT made of a polysilicon film and an element made of an amorphous silicon film, in this embodiment mode, a diode can be formed over the plastic substrate 117 as shown in FIG. 1(E).

Subsequently, a method for mounting the present invention on a printed wiring board is described with reference to FIGS. 11(A) to 11(D). Note that the same part as that in FIGS. 1(A) to 1(E) is described by using the same reference numeral.

Figure 11A:
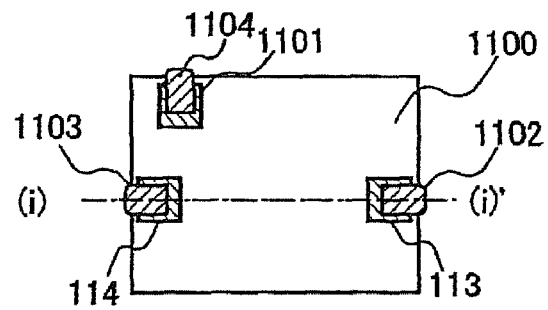
FIGS. 11(A) to 11(D) are diagrams showing a method for mounting a semiconductor device of the present invention.

FIG. 11(A) is a top view of a semiconductor device formed according to this embodiment mode, which is divided by laser cutting or dicing using laser light. Wirings 113, 114, and 1101 and connection wirings 1102 to 1104 for electrically connecting the wirings to wirings formed over a printed wiring board are formed on a surface of a semiconductor device 1100 manufactured according to this embodiment mode.

Figure 11B:
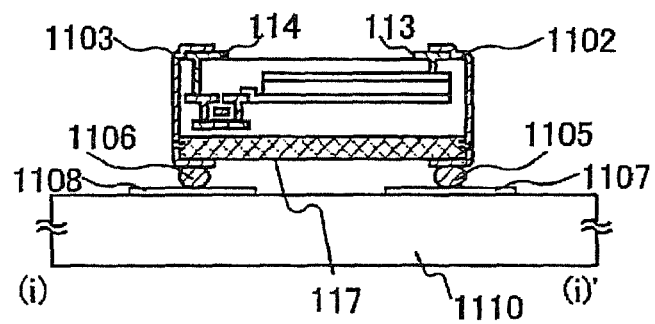

FIG. 11(B) is a cross-sectional view of the semiconductor device mounted on a printed wiring board 1110, along (i)-(i)' in FIG. 11(A). A TFT having an active region made of a polysilicon film and a diode having an active region made of an amorphous silicon film are formed over the plastic substrate 117. Connection wirings 1102, 1103, and 1104 (not shown) each connected to wirings 113, 114, and 1101 (not shown) are provided from a surface edge portion of the semiconductor device to a backside along a side face. The wiring 113 is a wiring connected to an electrode of the diode; the wiring 114 is a wiring connected to a drain electrode of the TFT; and the wiring 1101 is a wiring connected to a gate electrode of the TFT. Note that the connection wirings 1102 to 1104 are conductive films containing an element such as gold, copper, nickel, platinum, or silver, and can be formed by using a known technique such as an evaporation method or plating.

The connection wirings 1102 to 1104 are mounted by connecting with wirings (reference numerals 1107 and 1108) provided over the printed wiring board through external terminals 1105 and 1106. Note that a bump made of metal (such as gold, silver, or solder), a bump made of a conductive resin, or the like can be used for the external terminals 1105 and 1106.

Figure 11C:
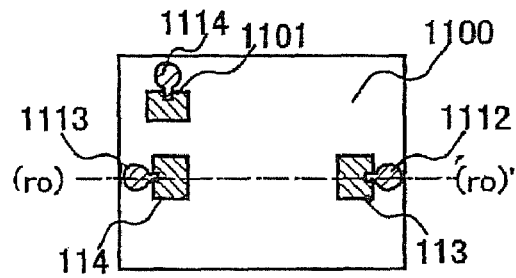
Figure 11D:
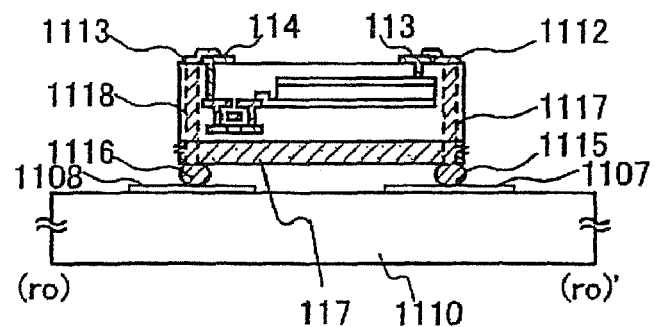

FIG. 11(C) and FIG. 11(D) show a mounting method different from that shown in FIG. 11(A) and FIG. 11(B). Note that the same part as that in FIGS. 1(A) to 1(E), FIG. 11(A), and FIG. 11(B) is described by using the same reference numeral.

FIG. 11(C) is a top view of the semiconductor device formed according to this embodiment mode that is divided by dicing. Wirings 113, 114, and 1101 are formed as in FIG. 1(A) and connection wirings 1112 to 1114 for electrically connecting the wirings to wirings formed over a printed wiring board are formed on a surface of a semiconductor device 1100 manufactured according to this embodiment mode.

FIG. 11(D) is a cross-sectional view of the semiconductor device mounted on a printed wiring board 1110, along (ro)-(ro)' in FIG. 11(C). A TFT having an active region made of a polysilicon film and a diode having an active region made of an amorphous silicon film are formed over the plastic substrate 117. Connection wirings 1112 to 1114 each connected to wirings 113, 114, and 1101 are formed. In addition, etching holes 1117 and 1118 which penetrate the semiconductor device are formed by a known method such as trench etching, and the wirings 113, 114, and 1101 and the external terminals 1115 and 1116 are electrically connected to one another by conductive materials 1112 to 1114 through the holes. Further, the external terminals 1115 and 1116 are mounted by connecting with wirings (reference numerals 1107 and 1108) provided over the printed wiring board. Note that the conductive materials 1112 to 1114 and the external terminals 1115 and 1116 can be made of similar materials to those of the conductive materials 1102 to 1104 and the external terminals 1105 and 1106 in FIG. 11(B) respectively.

The semiconductor device manufactured in this embodiment mode can function as an optical sensor or a photoelectric conversion element. Light entering the diode is absorbed by a photoelectric conversion layer to form an optical charge. The optical charge is amplified by a TFT and is detected.

A Schottky type diode in which a photoelectric conversion layer is interposed between an anode electrode and a cathode electrode is employed as a structure of the diode in the embodiment mode. Here, a PIN type or PN type diode, an avalanche diode, or the like can also be used as the photoelectric conversion element for converting light into an electrical signal, without limiting to the diode having the above structure.

Note that a PIN photodiode is structured by a p-type semiconductor layer, an n-type semiconductor layer, and an i-type (intrinsic) semiconductor layer interposed between the p-type semiconductor layer and the n-type semiconductor layer.

In addition, a photoelectric conversion element having a photoelectric conversion layer made of an organic material, or the like, specifically, a transparent ITO electrode, an organic pigment (perylene pigment: Me-PTC) which is vacuum evaporated thereover, and a gold electrode formed thereover, and the like may also be used as the photoelectric conversion element.

Further, a TFT having amorphous silicon as an active region can be used as the photoelectric conversion element.

A lightweight and thin substrate can be used for the semiconductor device manufactured according to this embodiment mode; therefore, volume thereof can be reduced compared with that of a conventional semiconductor device. Consequently, downsizing and lightweighting of electronic devices using the semiconductor devices can be achieved.

Note that a plastic substrate, typically, a flexible plastic substrate is used as the third substrate 117 in this embodiment mode; besides, it is possible to attach it to an organic resin of a package in which an IC chip, or the like is sealed, or the like. In this case, area occupied by a part on a printed wiring board can be reduced. Namely, area of the printed wiring board can be reduced.

Embodiment Mode 2

A method for manufacturing a semiconductor device over a plastic substrate, typically, a flexible plastic substrate in a different way from that in Embodiment Mode 1 is described in this embodiment mode with reference to FIGS. 2(A) to 2(E).

Figure 2A:
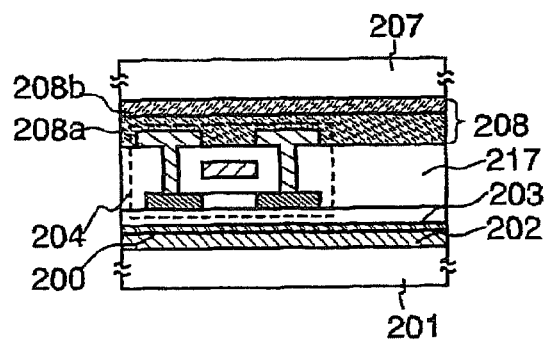
FIGS. 2(A) to 2(E) are diagrams showing Embodiment Mode 2 of the present invention.

As in Embodiment Mode 1, a metal film 202, an insulating film 203, and a TFT 204 are sequentially formed over a first substrate 201 as shown in FIG. 2(A). At this time, a metal oxide film 200 in an amorphous state is formed between the metal film 202 and the insulating film 203 to have a thickness of approximately from 2 nm to 5 nm, as in Embodiment Mode 1.

Note that the TFT 204 includes a polysilicon film having a source region, a drain region, and a channel formation region, a gate insulating film covering the polysilicon film, a gate electrode formed over the channel formation region of the polysilicon film, and a source electrode and a drain electrode which are connected to the source region and the drain region through an interlayer insulating film. In addition, the interlayer insulating film 217 is formed by using a plurality of insulating films for insulating the gate electrode from the source electrode and the drain electrode.

Next, a second substrate 207 is attached to the TFT 204 and the interlayer insulating film 217 thereof by using an adhesive 208 made of an organic resin. A similar adhesive to the adhesive 116 in Embodiment Mode 1 can be used for the adhesive 208 made of an organic resin. In this embodiment mode, a water-soluble resin 208a is applied as the adhesive made of an organic material; a member 208b with both sides thereof covered with a reactive separating adhesive (hereinafter, referred to as a double-sided sheet) is attached thereto; then, the second substrate 207 is attached thereto. A similar substrate to the second substrate 115 in Embodiment Mode 1 can be appropriately used as the second substrate 207.

Figure 2D:
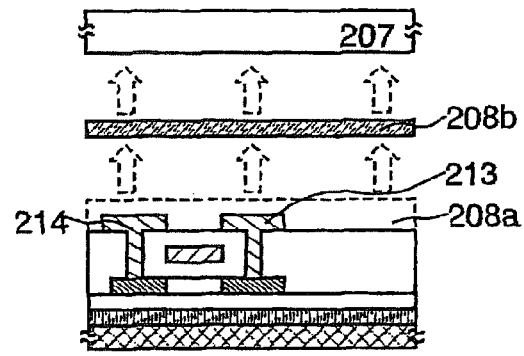
Figure 2B:
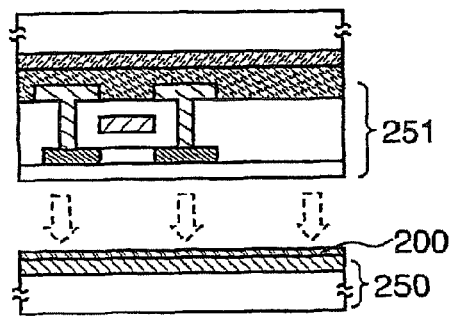

In FIG. 2(B), the first substrate 201 and the metal film 202 are a separation body 250, and the insulating film 203 and the TFT 204 are a laminate body 251. As in Embodiment Mode 1, the metal film 202 and the insulating film 203, that is, the separation body 250 and the laminate body 251 are separated from each other by a physical means. Separation occurs within the metal oxide film 200, at the interface between the insulating film 203 and the metal oxide film 200, or at the interface between the metal oxide film 200 and the metal film 202; thus, the separation body 250 and the laminate body 251 can be separated with comparatively small force.

Figure 2E:
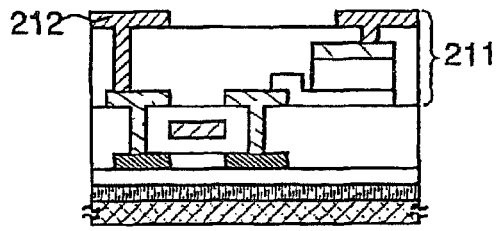
Figure 2C:
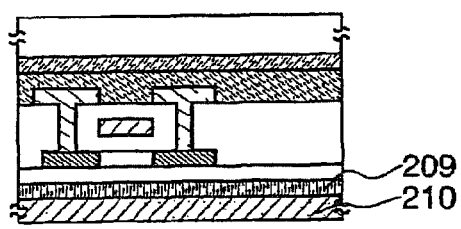

Subsequently, a third substrate 210 and the insulating film 203 (that is, the laminate body 251) are attached to each other by an adhesive bond 209 as shown in FIG. 2(C). A similar substrate to that used as the third substrate 117 and a similar adhesive bond to that used as the adhesive bond 118 in Embodiment Mode 1 can be used as the third substrate 210 and the adhesive bond 209.

Note that the insulating film 103 may be provided with an adhesive instead of the above step, as in Embodiment Mode 1. In this case, exfoliate paper (separate paper, that is, a base material such as a separator and a sheet having a separation surface on either of or both sides) may be provided so that the adhesive does not attach to another member. When the separate paper is separated, the adhesive can attach to an arbitrary member. Therefore, a substrate is not necessary, and a semiconductor device can be made thinner.

After the second substrate 207 is separated from the double-sided sheet 208b, the double-sided sheet 208b is separated as shown in FIG. 2(D). Note that the double-sided sheet 208b and the second substrate 207 may be simultaneously separated from the water-soluble resin 208a.

Subsequently, the water-soluble resin 208a is dissolved in water and is removed. When the water-soluble resin is left, it may cause a defect. Therefore, it is preferable to make the surfaces of the source electrode 213 and the drain electrode 214 clean by washing treatment or $O_2$ plasma treatment.

Next, a photoelectric conversion element 211 is formed over the source electrode 213, and a wiring 212 connected to an output terminal is formed over the drain electrode 214 as shown in FIG. 2(E). In this embodiment mode, a photoelectric conversion element 211 formed of a diode is formed as in Embodiment Mode 1. A known method may be employed as a method for manufacturing the diode.

Note that the diode is used for the photoelectric conversion element 211 in this embodiment mode; however, the photoelectric conversion element is not limited thereto. A TFT having amorphous silicon in an active region may be used. In addition, the one having a photoelectric conversion layer made of an organic material, and the like, specifically, a transparent ITO electrode, an organic pigment (perylene pigment: Me-PTC) which is vacuum evaporated thereover, a gold electrode formed thereover, and the like may also be used as the photoelectric conversion element 211.

According to the above steps, a semiconductor device including a TFT having a polysilicon film as an active region and an element having an amorphous silicon film as an active region, in this embodiment mode, a photoelectric conversion element can be formed over a plastic substrate.

Note that the semiconductor device formed in this embodiment mode can be mounted on a printed wiring board also in this embodiment mode by applying the mounting method as described in Embodiment Mode 1.

Embodiment

Embodiment 1

An example of manufacturing an optical sensor including a TFT having a polysilicon film as an active region and a diode having an amorphous silicon film as an active region by using the steps of Embodiment Mode 2 is described in this embodiment with reference to FIGS. 3(A) to 3(D). Note that the optical sensor of this embodiment is a non-storage type optical sensor.

Figure 3A:
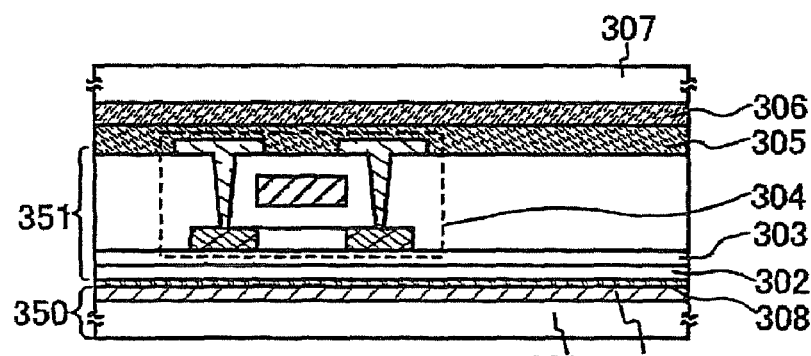
FIGS. 3(A) to 3(D) are diagrams showing Embodiment 1 of the present invention.

A TFT 304 is formed over a glass substrate (first substrate 300) as shown in FIG. 3(A). A metal film 301, here, a tungsten film (film thickness: 80 nm) is formed over the glass substrate by a sputtering method, and further, an insulating film 302, here, a silicon oxide film (film thickness: 160 nm) is laminated without being exposed to atmospheric air by a sputtering method. At this time, a tungsten oxide film 308 in an amorphous state is formed between the tungsten film 301 and the silicon oxide film 301 to have a thickness of approximately from 2 nm to 5 nm. Since the tungsten film and the silicon oxide film are formed also on an end face of the substrate by a sputtering method, it is preferable to selectively remove them formed on the end face of the substrate by $O_2$ ashing or the like. In the following step of separation, separation occurs at the interface between the tungsten film 301 and the tungsten oxide film 308, within the tungsten oxide film 308, or at the interface between the tungsten oxide film 308 and the silicon oxide film 302.

Subsequently, a silicon oxynitride film 303 (film thickness: 100 nm) to be a base insulating film is formed by a PCVD method, and further, an amorphous silicon film (film thickness: 54 nm) is laminated without being exposed to atmospheric air.

After forming a polysilicon film by using a known technique (a solid-phase growth method, a laser crystallization method, a crystallization method using catalytic metal), patterning is performed to form a polysilicon region having a desired shape, and thus, the TFT 304 having the polysilicon region as an active region is manufactured. Formation of a gate insulating film, formation of a gate electrode, formation of a source region or a drain region by doping into an active region, formation of an interlayer insulating film, formation of a source electrode or a drain electrode, activation treatment, and the like are appropriately performed. In this embodiment, a P-type channel type TFT is formed as the TFT.

In FIG. 3(A), the first substrate 300 and the tungsten film 301 formed thereover are referred to as a separation body 350. In addition, a layer from the silicon oxide film 302 to the TFT 304 is referred to as a laminate body 351.

Next, an adhesive 305 which is soluble in water or alcohols is applied to an entire surface and is baked. The adhesive may have any composition, for example, epoxy series, acrylate series, silicon series, or the like. Here, a film (film thickness: 30 μm) 305 made of a water-soluble resin (manufactured by TOAGOSEI Co., Ltd.: VL-WSHL10) is applied by spin-coating, and is temporarily cured, then, fully cured. Note that the water-soluble resin may be cured at a time without dividing a step of curing the water-soluble resin into two stages of temporary curing and full curing.

Subsequently, treatment for partly weakening adhesiveness between the tungsten film 301 and the silicon oxide film 302 is performed to make later separation easier. The treatment for partly weakening adhesiveness is carried out by partly irradiating the tungsten film 301 or the silicon oxide film 302 with laser light along the periphery of a region to be separated, or damaging the inside or a part of the interface of the tungsten oxide film 301 with pressure locally applied thereto from outside along the periphery of a region to be separated. Specifically, a hard needle such as a diamond pen may be perpendicularly pressed and moved with loading applied. Preferably, a scriber device is used, and may be moved with loading applied and with press force ranging from 0.1 mm to 2 mm. Thus, it is important to make a portion that easily causes a separation phenomenon, that is, a trigger before carrying out separation. Such pretreatment as selectively (partly) weakening the adhesiveness prevents a separation defect and improves a yield. Note that this step may be performed before the adhesive 305 that is soluble in water or alcohols is applied to an entire surface.

Next, a second substrate 307 is attached to the adhesive 305 made of a water-soluble resin by using a double-sided sheet 306. In addition, a third substrate (not shown) is attached to the first substrate 300 by using the double-sided sheet. The third substrate prevents the first substrate 300 from being damaged in the following separation step. A substrate having higher rigidity than that of the first substrate 300, for example, a quartz substrate or the like is preferably used as the second substrate 307 and the third substrate. Note that the double-sided sheet is a member having a UV separating adhesive on both sides thereof in this embodiment.

Subsequently, the first substrate 300 provided with the tungsten film 301 is separated from a side of the region in which adhesiveness is partly weakened by a physical means. In this embodiment, separation occurs within the tungsten oxide film 308. The first substrate 300 can be separated by comparatively small force (for example, a human hand, air pressure of a gas sprayed from a nozzle, ultrasonic waves, or the like). Thus, the laminate body 351 including the silicon oxide film 302 can be separated from the first substrate 300.

Since tungsten oxide remains on the surface of the silicon oxide film 302, it is removed by dry etching or the like in this embodiment. Note that the tungsten oxide film may not be necessarily removed.

Figure 3B:
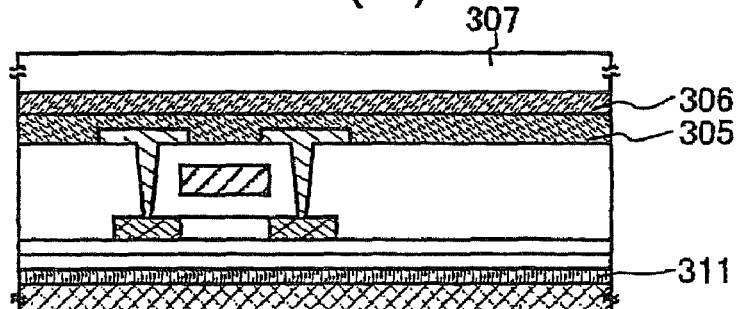

Subsequently, a fourth substrate 312 and the laminate body 351 including the silicon oxide film 302 are attached to each other by an adhesive bond 311. FIG. 3(B) shows a state after separation. It is important that the adhesive bond 311 has higher adhesiveness between the oxide film 302 (and the laminate body 351) and the fourth substrate 312 than that of the double-sided sheet 306 between the second substrate 307 and the laminate body 351.

A polyethylene terephthalate substrate (PET substrate) is used as the fourth substrate 312. In addition, a UV curing adhesive bond is used as the adhesive bond 311.

After the second substrate 307 is separated from the double-sided sheet 306, the double-sided sheet 306 is separated from the adhesive 305 that is soluble in water or alcohols.

Figure 3C:
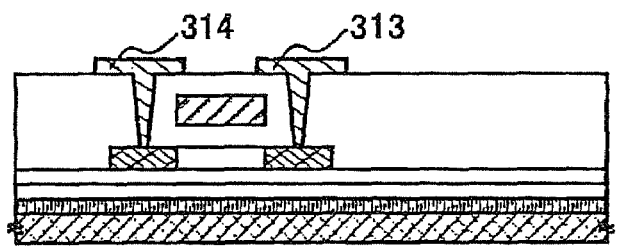

Thereafter, the adhesive 305 that is soluble in water or alcohols is dissolved in water and is removed. FIG. 3(C) shows a state at this time. When the adhesive that is soluble in water or alcohols is left, it may cause a defect. Therefore, it is preferable to make the surfaces of a source electrode 313 and a drain electrode 314 of the TFT clean by washing treatment or $O_2$ plasma treatment.

Figure 3D:
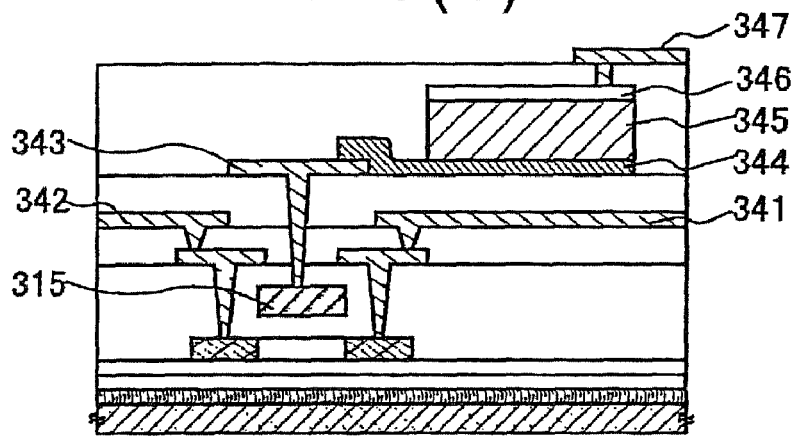

After wirings 341 and 342 each connected to the source electrode 313 and the drain electrode 314 of the TFT are formed, a wiring 343 connected to a gate electrode 315 of the TFT through an interlayer insulating film is formed as shown in FIG. 3(D). The wiring 343 connected to the gate electrode preferably covers the polysilicon region that is an active region of the TFT and preferably has function of a light shielding film. Note that the wiring 341 connected to the source electrode 313 is connected to a power line (reference numeral 406 in FIG. 4) and the wiring 342 connected to the drain electrode is connected to a second resistor (reference numeral 404 in FIG. 4) and an output terminal (reference numeral 408 in FIG. 4). Thereafter, an anode electrode 344 of the diode is formed. The anode electrode 344 is connected to the wiring 343 and a first resistor (reference numeral 403 in FIG. 4) which are connected to the gate electrode of the TFT, and is formed by using a thin film containing Ni in this embodiment.

Then, a silicon film 345 having each conductive layer of P, I, and N is formed over the anode electrode 344 by a plasma CVD method. Here, a microcrystal layer is used for the P and N conductive layers to increase conductivity, and an amorphous layer is used for the I type conductive layer, and a film thickness of the laminated silicon thin film is set 800 nm. Note that the P layer, the I layer, and the N layer are in this order from a layer in contact with the anode electrode, and a cathode electrode 346 is formed over the N layer. ITO is used for the cathode electrode 346 in this embodiment.

Subsequently, a wiring 347 connected to the cathode electrode 346 through the interlayer insulating film and connected to the power line (reference numeral 406 in FIG. 4) is formed.

Thereafter, a printed wiring board and the output terminal of the optical sensor are connected by using an anisotropic conductive film (ACF), a flexible printed circuit (FPC), a TAB (Tape Automated Bonding) tape, or a TCP (Tape Carrier Package).

Figure 8A:
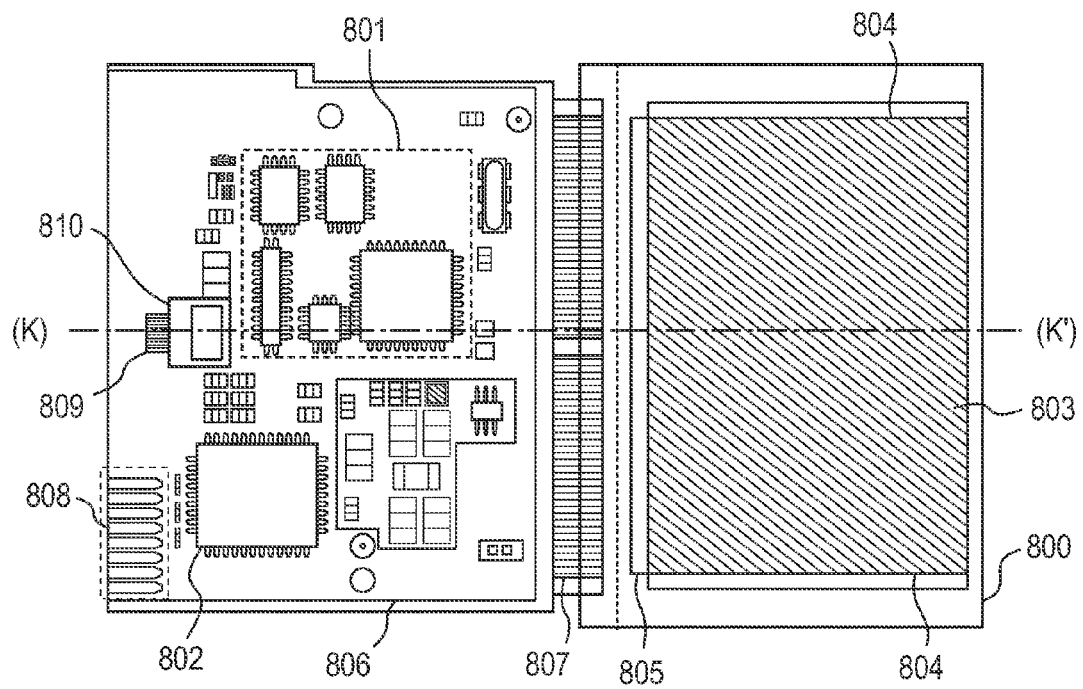
FIGS. 8(A) and 8(B) are diagrams showing Embodiment 1 of the present invention.
Figure 8B:
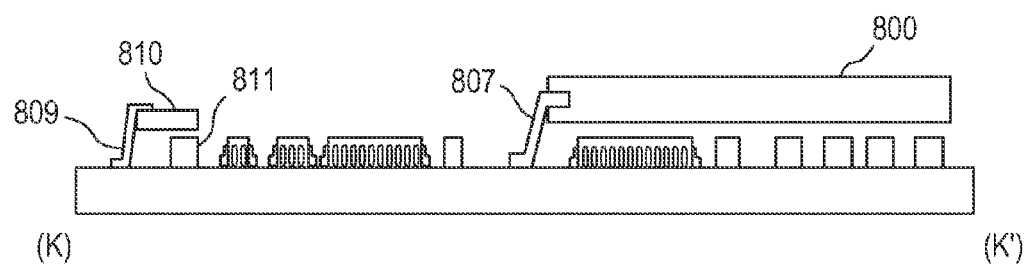

FIGS. 8(A) and 8(B) are a top view of a module of an electronic device to which this embodiment is applied and a cross-sectional view thereof.

FIG. 8(A) shows an appearance of a module on which a panel 800 is mounted. The panel 800 is provided with a pixel portion 803, a scanning line driver circuit 804 for selecting a pixel included in the pixel portion 803, and a signal line driver circuit 805 for supplying a video signal to the selected pixel.

In addition, a printed wiring board 806 is provided with a controller 801, a power supply circuit 802, and an optical sensor 810 provided through an FPC 809, and various kinds of signals and power supply voltage output from the controller 801 or the power supply circuit 802 are supplied through the FPC 807 to the pixel portion 803, the scanning line driver circuit 804, and the signal line driver circuit 805 of the panel 800.

The power supply voltage and the various kinds of signals are supplied to the printed wiring board 806 through an interface (I/F) portion 808 in which a plurality of input terminals is disposed.

FIG. 8(B) is a cross-sectional view along (K)-(K)' in FIG. 8(A). Since the FPC 807 is used for connection with the printed wiring board in this embodiment, the optical sensor 810 can be disposed over a package of an IC chip 811, a CPU, or the like which is disposed over the printed wiring board 806. In addition to enlarging light receiving area of the optical sensor, area of the printed wiring board can be narrowed.

Figure 4:
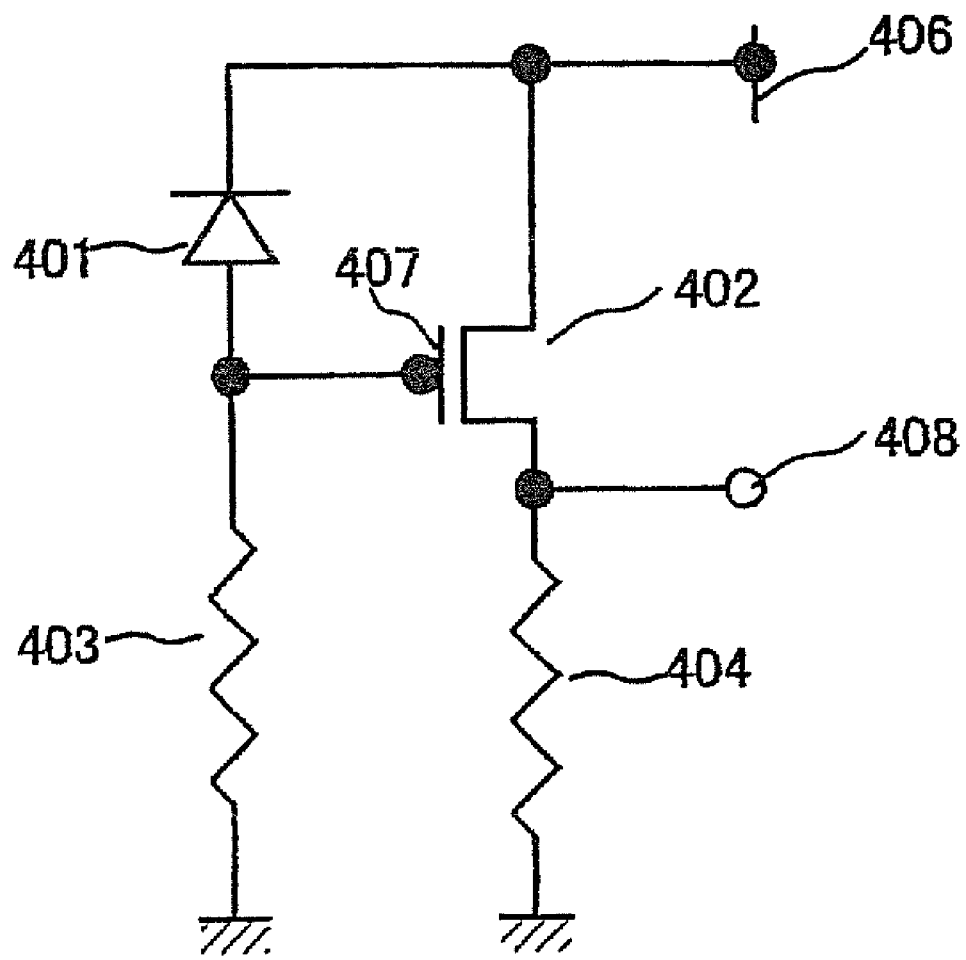
FIG. 4 is a diagram showing Embodiment 1 of the present invention.

FIG. 4 is a circuit diagram of a non-storage type optical sensor formed according to this embodiment. The diode (the anode electrode 344, the silicon semiconductor film 345, and the cathode electrode 346) in FIG. 3(D) corresponds to reference numeral 401 in FIG. 4. Note that the cathode electrode 346 of the diode is connected to the power line 406, and the anode electrode 344 is connected to the first resistor 403 and a gate electrode 407 of the TFT 402. In addition, the source electrode of the TFT is connected to the power line 406, and the drain electrode is connected to the output terminal 408 and the second resistor 404. Electromotive force generated in the diode 401 is applied to the gate electrode 407 of the TFT 402. Then, current flowing through the TFT 402 and the second resistor 404 is converted into voltage from a resistance value, and is detected by a voltage difference between the output terminal 408 and ground potential.

In this embodiment, the anode electrode 344 of the diode connected to the TFT 402 is made of Ni, and the cathode electrode 346 is made of ITO; however, the present invention is not limited to this structure. The anode electrode 344 may be a light transmitting conductive film, and the cathode electrode 346 may be a metal electrode. In this case, it is preferable to form a light shielding film in a lower part of the silicon film since the TFT is affected when light enters the TFT.

The anisotropic conductive film is used in this embodiment to connect the optical sensor to the printed wiring board; however, the present invention is not limited thereto. It is possible to connect by using conductive paste such as solder.

The optical sensor formed according to this embodiment includes an amplifying element formed of a diode having an active region made of an amorphous silicon film and a TFT having an active region made of a polysilicon film. Therefore, it can detect weak light even when a photoelectric conversion layer (light receiving layer) is small in area, that is, small size. In addition, the optical sensor can be made more lightweight and thinner compared with a conventional one, since it is formed over a plastic substrate. When the anisotropic conductive film is used for connection with the printed wiring board, the optical sensor can be disposed over a package of an IC chip, a CPU, or the like which is disposed over the printed wiring board. In addition to enlarging light receiving area of the optical sensor, area of the printed wiring board can be narrowed.

Note that Embodiment Mode 2 is applied to this embodiment, but this embodiment can be combined with Embodiment Mode 1.

Embodiment 2

Figure 9A:
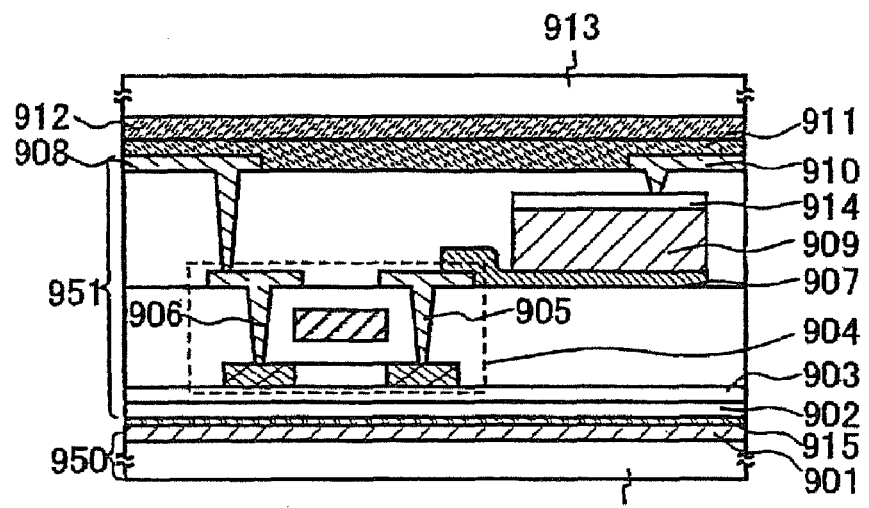
FIGS. 9(A) to 9(C) are diagrams showing Embodiment 2 of the present invention.
Figure 9B:
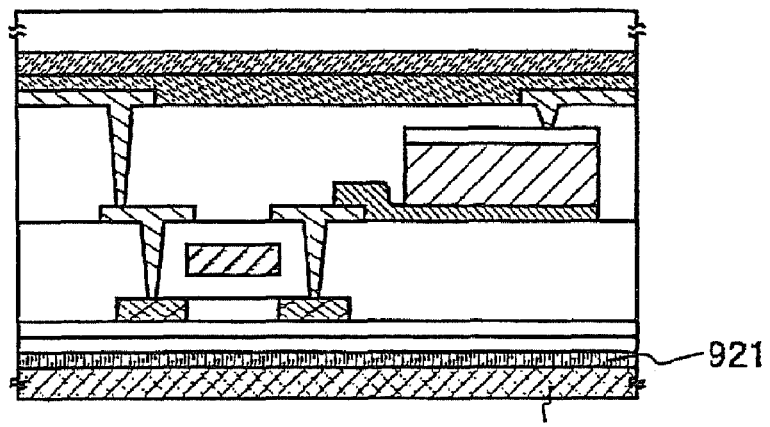
Figure 9C:
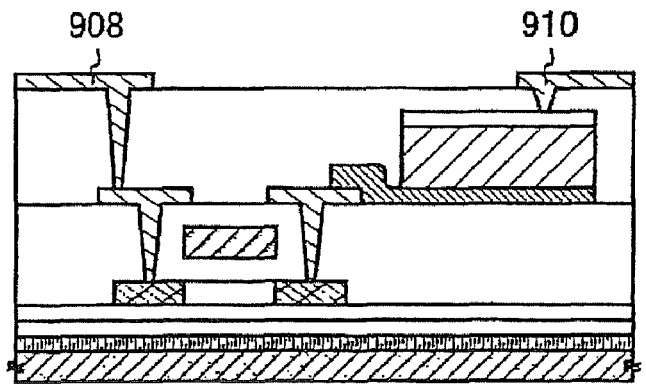

An example of manufacturing an optical sensor including a TFT having a polysilicon film as an active region and a diode having an amorphous silicon film as an active region by using the steps of Embodiment Mode 2 is described in this embodiment with reference to FIGS. 9(A) to 9(C). Note that an optical sensor of this embodiment is a storage type optical sensor, and an image of a facsimile machine, a scanner, and a radiation such as an X-ray can be read by using a plurality of one bit that is one pixel of the optical sensor, and high-performance and large-area photoelectric conversion device can be manufactured.

As shown in FIG. 9(A), a metal film 901 and an insulating film 902 are formed over a glass substrate (first substrate 900) as in Embodiment 1. In this embodiment, a tungsten film (film thickness: from 10 nm to 200 nm, preferably from 50 nm to 75 nm) is formed as the metal film 901, and further, the insulating film 902, here, a silicon oxide film (film thickness: from 150 nm to 200 nm) is laminated without being exposed to atmospheric air.

Subsequently, a silicon oxynitride film 903 (film thickness: 100 nm) to be a base insulating film is formed by a PCVD method, and an amorphous silicon film (film thickness: 54 nm) is laminated without being exposed to atmospheric air. At this time, a tungsten oxide film 915 in an amorphous state is formed between the tungsten film 901 and the silicon oxide film 902 to have a thickness of approximately from 2 nm to 5 nm.

The amorphous silicon film contains hydrogen, and in the case of forming a polysilicon film by heating, heat treatment at equal to or more than 500° C. for crystallization enables to diffuse hydrogen at the same time as forming the polysilicon film. A TFT can be formed by using the obtained polysilicon film. At this time, the tungsten oxide film 915 in an amorphous state is also crystallized.

Here, the polysilicon film is formed by using a known technique (a solid-phase growth method, a laser crystallization method, a crystallization method using catalytic metal, or the like). Subsequently, the polysilicon film is patterned to form a silicon region having a desired shape, and thus, a TFT 904 having the polysilicon region as an active region is manufactured. Formation of a gate insulating film, formation of a gate electrode, formation of a source region or a drain region by doping into the active region, formation of an interlayer insulating film, formation of a source electrode or a drain electrode, activation treatment, and the like are appropriately performed. In this embodiment, a P channel type TFT is formed as the TFT.

Subsequently, a wiring 907 connected to a source electrode 905 of the TFT 904 is formed. Note that the wiring 907 connected to the source electrode 905 is an anode electrode of a diode.

Then, a silicon semiconductor film 909 having each conductive layer of P, I, and N is formed over the anode electrode 907 by a plasma CVD method. Here, the silicon semiconductor film having each conductive layer of P, I, and N can be manufactured according to similar steps to those in Embodiment 1. Thereafter, a cathode electrode 914 is formed over the silicon semiconductor film. In this embodiment, ITO is used for the cathode electrode.

Subsequently, a wiring 910 connected to the cathode electrode and a wiring 908 connected to a drain electrode 906 of the TFT through an interlayer insulating film are formed. The wiring 910 is connected to a power line (reference numeral 1002 in FIG. 10(A)), and the wiring 908 is connected to a signal wiring (reference numeral 1004 in FIG. 10(A)).

In FIG. 9(A), the glass substrate 900 and the metal film 901 formed thereover are referred to as a separation body 950. In addition, a layer from the oxide film 902 to the wiring 910 connected to the diode and the cathode electrode of the diode is referred to as a laminate body 951.

Subsequently, an adhesive 911 that is soluble in water or alcohols is applied to an entire surface of the laminate body, and is baked. The adhesive 911 that is soluble in water or alcohols may have any composition, for example, epoxy series, acrylate series, silicon series, or the like. Here, a film (film thickness: 30 μm) made of a water-soluble resin (manufactured by TOAGOSEI Co., Ltd.: VL-WSHL10) is applied by spin coating, and is temporarily cured, then, fully cured. Note that the water-soluble resin may be cured at a time without dividing a step of curing the water-soluble resin into two stages of temporary curing and full curing. Subsequently, treatment for partly weakening adhesiveness between the metal film 901 and the oxide film 902 is performed to make later separation easier. This step may be similar one to that in Embodiment 1.

Then, a holding substrate 913 is attached to the adhesive 911 that is soluble in water or alcohols by using a double-sided sheet 912. After the adhesiveness is partly weakened as described in Embodiment 1, separation is caused from a side of the region in which the adhesiveness is partly weakened, and the glass substrate 900 provided with the metal film 901 is separated by a physical means. In this embodiment, separation occurs within the tungsten oxide film 915. When the tungsten oxide film remains on the surface of the oxide film 902, the tungsten oxide film is preferably removed by dry etching or the like. In this way, the laminate body 951 including the oxide film 902 can be separated from the glass substrate 900.

Next, a plastic substrate 922 and the laminate body 951 including the oxide film 902 are attached to each other by an adhesive bond 921 as shown in FIG. 9(B). It is important that the adhesive bond 921 has higher adhesiveness between the oxide film 902 (and the laminate body 951) and the plastic substrate 922 than that of the double-sided sheet 912 between the holding substrate 913 and the laminate body 951.

A polycarbonate substrate (PC substrate) is used as the plastic substrate 922. In addition, a UV curing adhesive bond is used as the adhesive bond 921.

After the holding substrate 913 is separated from the double-sided sheet 912, the double-sided sheet 912 is separated from the adhesive 911 that is soluble in water or alcohols.

Thereafter, the adhesive 911 that is soluble in water or alcohols is dissolved in water and is removed. When the adhesive is left, it may cause a defect. Therefore, it is preferable to make the surfaces of the wiring 910 connected to the cathode electrode 914 of the diode and the wiring 908 connected to the drain electrode of the thin film transistor clean by washing treatment or $O_2$ plasma treatment.

Figure 10A:
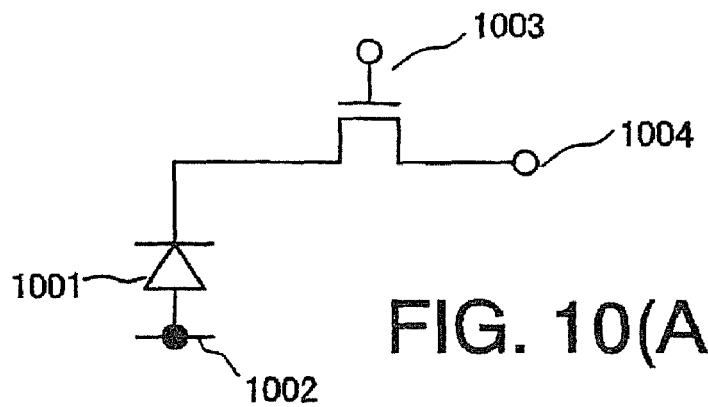
FIGS. 10(A) and 10(B) are diagrams showing Embodiment 2 of the present invention.

Thereafter, exposed wirings 908 and 910 on the surface of the optical sensor are connected to the signal wiring (reference numeral 1004 in FIG. 10(A)) and the power line (reference numeral 1002 in FIG. 10(A)) respectively by using a module provided with an anisotropic conductive film (ACF), a flexible printed circuit (FPC), a TAB (Tape Automated Bonding) tape, or a TCP (Tape Carrier Package), a TAB tape, or a TCP.

FIG. 10(A) shows an equivalent circuit of one bit that is one pixel of the storage type optical sensor formed according to this embodiment. In FIG. 10(A), the equivalent circuit includes a diode 1001 in which the anode electrode 907 is connected to the power line 1002 and the cathode electrode 914 is connected to the source electrode of a TFT 1003 and the TFT 1003 for transferring an optical charge stored in the diode by a transfer switch function according to a control signal of a gate electrode. The drain electrode of the TFT is connected to the signal wiring 1004. The charge generated in the diode is transferred to a capacitor (not shown) over the signal wiring through the TFT, and is read by a read out circuit (not shown) connected to the signal wiring.

Figure 10B:
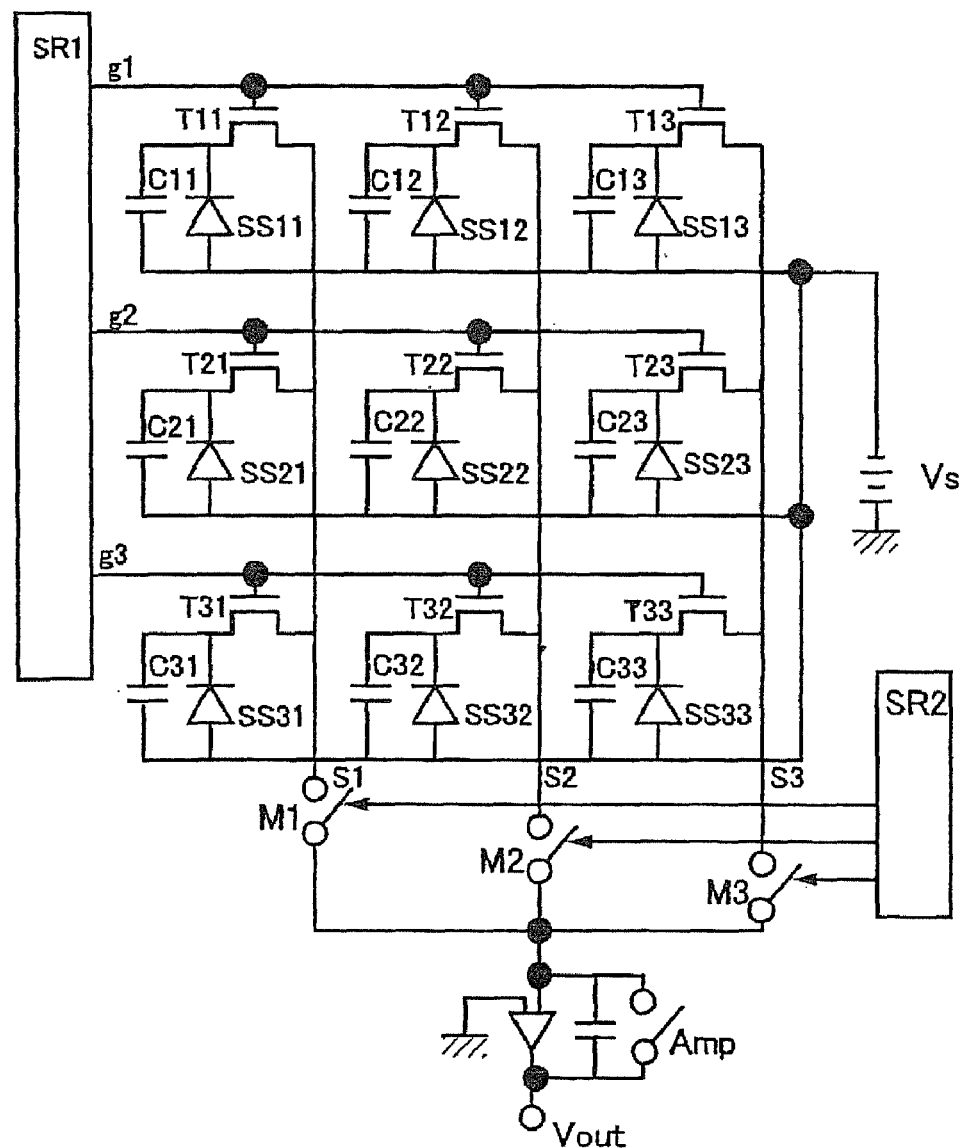

FIG. 10(B) shows an equivalent circuit in the case of arranging the equivalent circuit of one bit shown in FIG. 10(A) in a 3 by 3 array. A driving method is described with reference to FIG. 10(B).

First, a gate signal line g1 of a shift register SR1 is activated to turn on charge transfer transistors T11 to T13 of the pixels in the first column, and optical charges of diodes SS11 to SS13 are output to signal wirings S1 to S3. Next, control signals of transfer switches M1 to M3 of a shift register SR2 are sequentially made active, and optical charges of SS11 to SS13 which are amplified by a buffer amplifier (Amp) are read by Vout in chronological order. Then, a gate signal line g2 of the shift register SR1 is activated. Such a procedure is repeated to read the optical charge of each pixel, that is, the diode.

In this embodiment, the anode electrode 907 of the diode connected to the TFT is made of Ni, and the cathode electrode 914 is made of ITO; however, the present invention is not limited to this structure. The anode electrode 907 may be a light transmitting conductive film, and the cathode electrode 914 may be a metal electrode. In this case, it is preferable to form a light shielding film in a lower part of the silicon film since the TFT is affected when light enters the TFT.

In addition, the anisotropic conductive film is used to connect the wirings 910 and 908 exposed on the surface of the optical sensor to the power line (reference numeral 1002 in FIG. 10(A)) and the signal wiring (reference numeral 1004 in FIG. 10(A)) respectively; however, the present invention is not limited thereto. They can be connected by the mounting method as described in Embodiment Mode 1.

According to the above steps, a photoelectric conversion device including a plurality of optical sensors can be formed over a plastic substrate. Namely, a photoelectric conversion device provided with a plurality of optical sensors including a TFT having a polysilicon as an active region and a diode having amorphous silicon as an active region can be manufactured.

The photoelectric conversion device formed according to this embodiment includes a plurality of optical sensors formed of an amplifying element which has a diode made of an amorphous silicon film and a TFT made of a polysilicon film. Therefore, it can detect weak light and is highly sensitive even when a photoelectric conversion layer (light receiving layer) is small in area, that is, small size. In addition, the photoelectric conversion device can be made more lightweight and thinner compared with a conventional one, since it is formed over a plastic substrate. When an anisotropic conductive film is used for connection with a driver circuit such as a shift register or a power line, the photoelectric conversion device can be placed over a package composed of an IC chip, a driver circuit, a power supply circuit, or the like which is disposed over the printed wiring board. In addition to enlarging light receiving area of the photoelectric conversion device, area of the printed wiring board can be reduced.

Embodiment 3

Figure 5A:
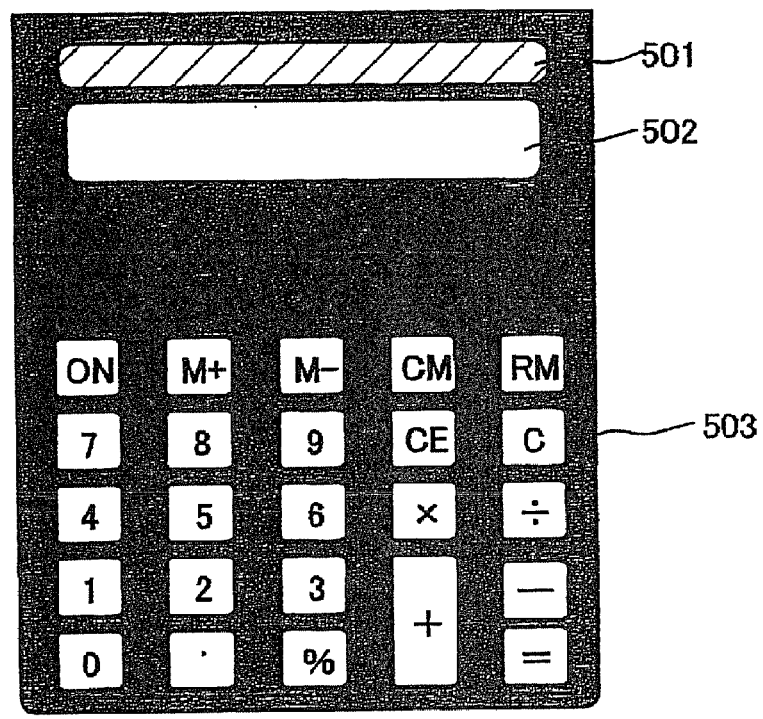
FIGS. 5(A) and 5(B) are diagrams showing Embodiment 3 of the present invention.
Figure 5B:
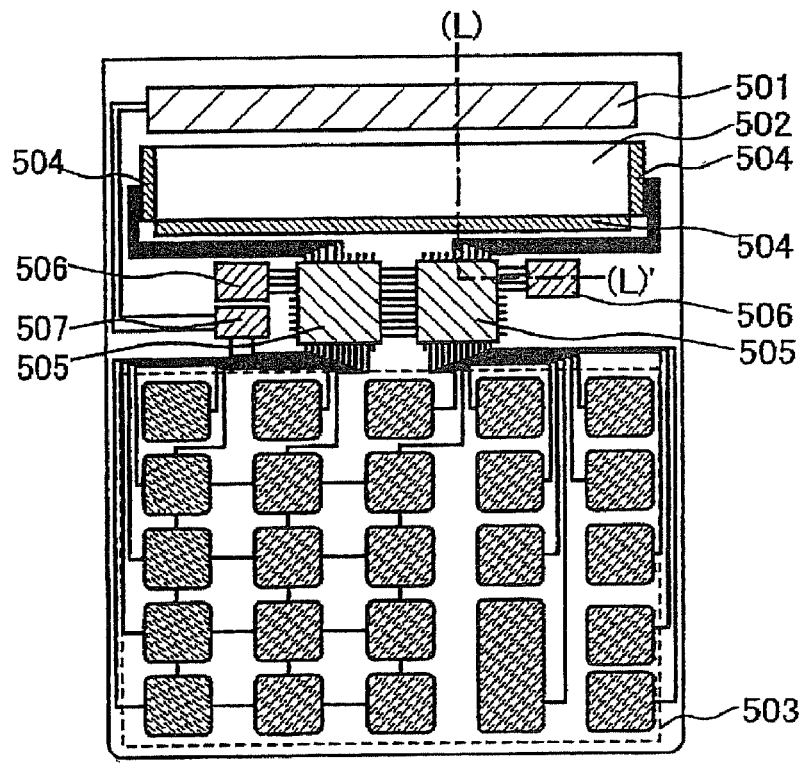

An example of manufacturing an electronic device having an integrated circuit (IC) composed of a semiconductor element having a polysilicon film as an active region and a semiconductor element having an amorphous silicon as an active region, typically, an IC card over a plastic substrate is described here with reference to FIGS. 5(A) to 7(B). In this embodiment, a card type calculator as shown in FIGS. 5(A) and 5(B) is given as an IC card for explanation. FIG. 5(A) is a top view of the card type calculator, and FIG. 5(B) is a top view of a module of the card type calculator formed over a plastic substrate. Note that the one provided with a keypad 503 by a known method is used as the plastic substrate in this embodiment. A calculator which uses a solar battery 501 as a power source and an EL display device for a display portion 502 that is a part of an output portion and which has a driver circuit 504 of the display portion, a keypad 503 that is a part of an input portion, a central processing unit 505 (CPU) and a memory 506, and a power supply circuit 507 connected to the solar battery, as shown in FIG. 5(A), and a manufacturing method thereof are described.

Figure 6:
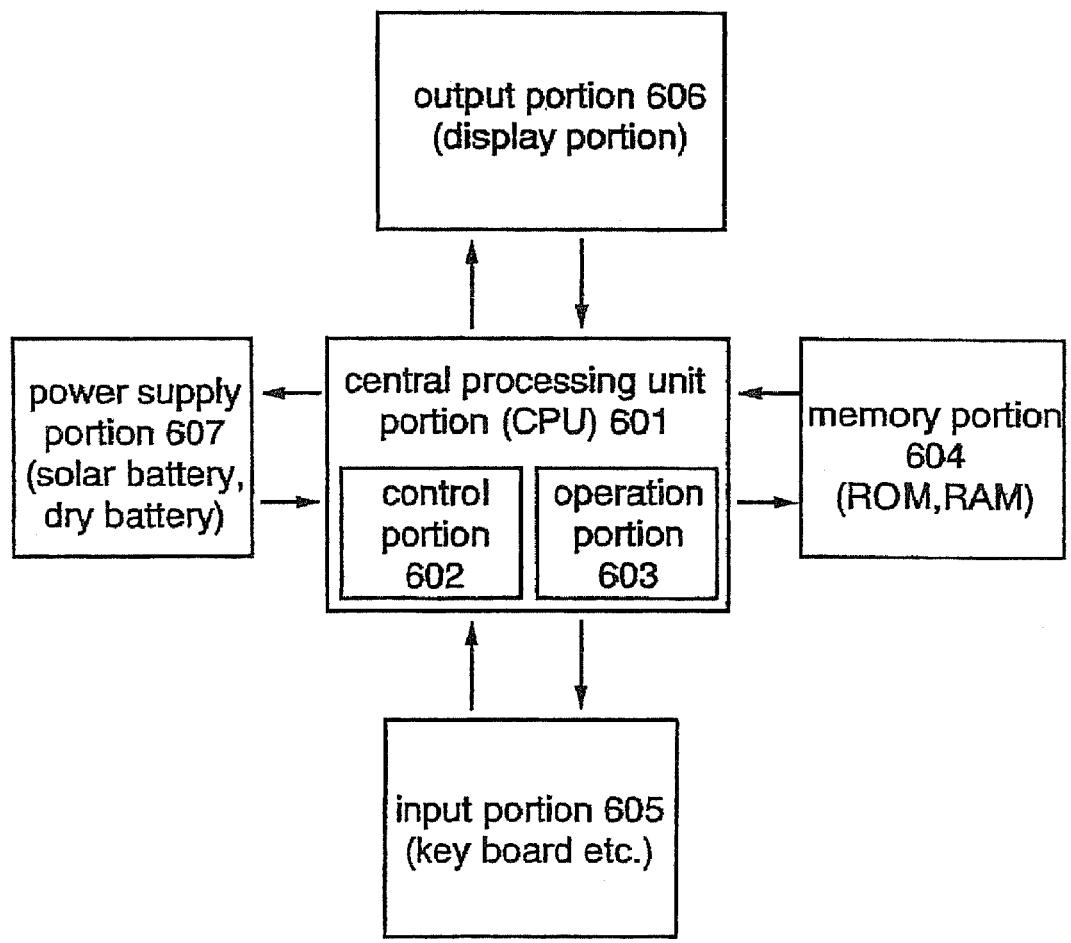
FIG. 6 is a diagram showing Embodiment 3 of the present invention.

FIG. 6 is a block diagram of the IC card, in this embodiment, the card type calculator. Reference numeral 601 denotes a central processing unit (hereinafter, referred to as a CPU); 602, a control portion; 603, an operation portion; 604, a memory; 605, an input portion; 606, an output portion; and 607, a power supply portion.

The CPU 601 includes the operation portion 603 and the control portion 602. The operation portion 603 is composed of an arithmetic logic unit (ALU) for performing arithmetic operations such as addition and subtraction and logical operations such as AND, OR, and NOT, various registers for temporarily storing data or results of the operations, a counter for counting the number of input 1, and the like.

Circuits composing the operation portion 603, such as an AND circuit, an OR circuit, a NOT circuit, a buffer circuit, and a resistor circuit can be formed of TFTs. A semiconductor film that is crystallized by using continuous wave laser light may be formed as an active region of the TFT to obtain high field effect mobility. A method for obtaining a polysilicon film by irradiating an amorphous silicon film with continuous wave laser light may be employed. A method for obtaining a polysilicon film by irradiating with continuous wave laser light after obtaining a polysilicon film by heating an amorphous silicon film may also be adopted. Moreover, a method for obtaining a polysilicon film by irradiating with continuous wave laser light after adding a metal element which serves as a catalyst to an amorphous silicon film and obtaining a polysilicon film by heating may be employed. In this embodiment, a channel length direction of the TFT composing the operation portion 603 and a scanning direction of a laser beam are arranged in the same direction.

The control portion 602 has a function of executing an instruction stored in the memory 604 and controlling the whole operation. The control portion 602 includes a program counter, an instruction register, and a control signal generating portion. In addition, the control portion 602 can also be formed of the TFTs and can be manufactured by using a polysilicon film crystallized with continuous wave laser light as an active region of the TFT. In this embodiment, a channel length direction of the TFT composing the control portion 602 and a scanning direction of a laser beam are arranged in the same direction.

The memory 604 is a portion that stores data and instructions for performing calculation, and data or programs that are often executed in the CPU are stored. The memory 604 includes a main memory, an address register, and a data register. A cache memory in addition to the main memory may be used. These memories may include an SRAM, a DRAM, a flash memory, or the like. When the memory 604 is also composed of TFTs, it can be manufactured by using a crystallized polysilicon film with continuous wave laser light as an active region of the TFTs. In this embodiment, a channel length direction of the TFT composing the memory 604 and a scanning direction of a laser beam are arranged in the same direction.

The input portion 605 is a device that receives data or programs from the outside. The output portion 606 is a device for displaying results, typically, a display device.

The power supply portion 607 is a device that supplies necessary electric power for operating the CPU or the like. In this embodiment, the power supply portion includes a solar battery. Note that a secondary battery storing electric power generated in the solar battery may be included. When an electroluminescence display (EL display) is used for a display device of the output portion 606, power consumption is low, and therefore, drive power is low. A circuit and a capacitor element of the power supply portion can be formed of a TFT. In this case, the TFT can be manufactured by using a polysilicon film crystallized with continuous wave laser light as an active region. In this embodiment, a channel length direction of the TFT composing the power supply portion and a scanning direction of a laser beam are arranged in the same direction.

A CPU with few variations can be formed over an insulating substrate by arranging a channel length direction of the TFT and a scanning direction of a laser beam in the same direction. Although a circuit design and a manufacturing step become complicated, a CPU, an output portion, a memory, and a power supply portion can be formed over the same substrate. It is preferable to arrange a channel length direction of a plurality of TFTs disposed in each pixel and a scanning direction of a laser beam in the same direction in the display portion.

An example of transferring a module of a card type calculator formed over a glass substrate onto a plastic substrate provided with a keypad is described hereinafter with reference to FIGS. 7(A) and 7(B). FIGS. 7(A) and 7(B) are cross-sectional views along (L)-(L)' in FIG. 5(B). As in Embodiment 1, a silicon oxide film 703 is formed over a glass substrate 701 with a tungsten film 702 therebetween. At this time, a tungsten oxide film 712 in an amorphous state is formed between the tungsten film 702 and the silicon oxide film 703 to have a thickness of approximately from 2 nm to 5 nm. Next, an amorphous silicon film is formed over the silicon oxide film. Thereafter, a crystalline silicon film is formed by a known method, and this film is used for an active region of a TFT of a pixel region 751, a TFT of a driver circuit 752 of a pixel, a TFT of a CPU 753, a capacitor element of a memory 755, or the like. Then, n-channel type TFTs 705, 707, and 709, p-channel type TFTs 704, 706, and 708, capacitor portions 710 and 711, a terminal portion (not shown), and the like are formed by a known method. A CMOS circuit can be formed by complementarily combining the n-channel type TFT 707 and the p-channel type TFT 706, and the n-channel type 709 and the p-channel type TFT 708 respectively, and various integrated circuit such as the CPU and the driver circuit can be formed. Note that it is preferable to employ a method using continuous wave laser light as described in this embodiment for a method for forming an active region of the CPU, the driver circuit, or the like.

Subsequently, a solar battery 721 connected to a drain electrode of a TFT (not shown) of a power supply circuit is formed in a power supply portion 754. Specifically, a diode having an active region made of amorphous silicon 723 is formed over a conductive film 722 connected to the TFT of the power supply circuit. Note that the capacitor element 711 connected to the solar battery is formed in a lower portion of the solar battery in this embodiment. This is because it temporarily stores electric energy generated in the solar battery. Electric energy is not run out during use and it can be used in a dark place.

Next, a pixel 724 connected to a drain electrode of the switching TFT 704 in the pixel region is formed. In this embodiment, an EL display device is used as a display device. Note that a known display device such as a liquid crystal display device can also be used.

Subsequently, a lead wiring, an input-output terminal, and the like are appropriately formed after forming an insulating film covering these elements.

Then, a holding substrate 732 is attached by an adhesive 731 (removable adhesive such as a water-soluble adhesive or a double-sided sheet) (FIG. 7(A)).

Subsequently, the glass substrate 701 and the tungsten film 702 are separated from the silicon oxide film 703 by applying mechanical force between the metal film 702 and the oxide film 703. In this embodiment, separation occurs within the tungsten oxide film 712. When the tungsten oxide remains on the surface of the silicon oxide film, the tungsten oxide may be removed by dry etching or the like. Thereafter, aplastic substrate 734 provided with a keypad is fixed to the surface of the silicon oxide film 703 with an adhesive bond 733 therebetween.

Subsequently, the holding substrate 732 is removed by removing the adhesive 731 (FIG. 7(B)). Thereafter, a protective film (not shown) such as a sticker in which numerical number and a mark of a keyboard are drawn on its surface is formed. In this way, an integrated circuit (IC) including a TFT having crystalline silicon as an active region and a diode having amorphous silicon as an active region can be completed over the plastic substrate 734. Namely, an IC card of a card type calculator or the like including the power supply portion 754 formed by using a solar battery, the pixel region 751, an integrated circuit (IC) including the driver circuit 752 of a pixel, the CPU 753, the memory 755, and the like can be formed over the plastic substrate.

An electronic device manufactured according to this embodiment, such as an IC card, is formed over a plastic substrate; therefore, it is thin and lightweight. In addition, a power supply portion, an input portion, a central processing unit, an output portion, and the like are formed over the same substrate; therefore, there is no step of attaching a plurality of panels, and throughput can be improved.

What is claimed is:
1. An electronic device comprising an optical sensor, the optical sensor comprising:
   a flexible substrate;
   a thin film transistor formed over the flexible substrate, the thin film transistor comprising:
      a crystalline semiconductor film;
      a gate electrode over the crystalline semiconductor film; and a source electrode and a drain electrode which are formed over and connected to the crystalline semiconductor film;

a semiconductor element formed over the thin film transistor, the semiconductor element comprising:
a first electrode;
a semiconductor film formed over the first electrode; and
a second electrode formed over the semiconductor film; and a wiring layer electrically connecting the gate electrode of the thin film transistor to the first electrode of the semiconductor element.

2. The electronic device according to claim 1, further comprising an interlayer insulating film over the crystalline semiconductor film,
wherein the interlayer insulating film comprises a plurality of insulating films and is arranged to insulate the gate electrode from the source electrode and the drain electrode.

3. The electronic device according to claim 1,
wherein the semiconductor film is located above the crystalline semiconductor film.

4. The electronic device according to claim 1,
wherein the flexible substrate is a plastic substrate or comprises an organic resin.

5. The electronic device according to claim 1, further comprises an adhesive between the flexible substrate and the thin film transistor.

6. The electronic device according to claim 1,
wherein the semiconductor film of the semiconductor element comprises:
a P type conductive layer formed over the first electrode;
an I type conductive layer formed over the P type conductive layer; and
an N type conductive layer formed over the I type conductive layer, and
wherein each of the P type conductive layer and the N type conductive layer is a microcrystal layer.

7. The electronic device according to claim 1,
wherein the wiring layer entirely covers a top surface of the gate electrode to allow the gate electrode to be shielded from external light.

8. An electronic device comprising:
a printed wiring board;
a display panel connected to and formed over the printed wiring board;
an integrated circuit connected to and formed over the printed wiring board; and
an optical sensor connected to the printed wiring board and formed over the integrated circuit,
wherein the optical sensor comprises a flexible substrate, a thin film transistor formed over the flexible substrate, and a semiconductor element formed over the thin film transistor,
wherein the thin film transistor comprises a crystalline semiconductor film, a gate electrode formed over the crystalline semiconductor film, and a source electrode and a drain electrode which are connected to and formed over the crystalline semiconductor film,
wherein the semiconductor element comprises a first electrode, a semiconductor film formed over the first electrode, and a second electrode formed over the semiconductor film,
wherein the optical sensor further comprises a wiring layer which electrically connects the gate electrode of the thin film transistor to the first electrode of the semiconductor element, and
wherein the semiconductor film of the semiconductor element is located above the crystalline semiconductor film of the thin film transistor.

9. The electronic device according to claim 8, further comprising an interlayer insulating film over the crystalline semiconductor film and underneath the first electrode,
wherein the interlayer insulating film comprises a plurality of insulating films and is arranged to insulate the gate electrode from the source electrode and the drain electrode.

10. The electronic device according to claim 8,
wherein the flexible substrate is a plastic substrate or comprises an organic resin.

11. The electronic device according to claim 8, further comprises an adhesive between the flexible substrate and the thin film transistor.

12. The electronic device according to claim 8,
wherein the semiconductor film of the semiconductor element comprises;
a P type conductive layer formed over the first electrode;
an I type conductive layer formed over the P type conductive layer; and
an N type conductive layer formed over the I type conductive layer,
wherein each of the P type conductive layer and the N type conductive layer is a microcrystal layer.

13. The electronic device according to claim 8,
wherein the semiconductor film of the semiconductor element comprises;
a P type conductive layer formed over the first electrode;
an I type conductive layer formed over the P type conductive layer; and
an N type conductive layer formed over the I type conductive layer,
wherein the I type conductive layer is an amorphous semiconductor layer.

* * * * *